United States Patent [19]
Yaguchi

[11] Patent Number: 5,860,084
[45] Date of Patent: Jan. 12, 1999

[54] METHOD FOR READING DATA IN A MEMORY CELL

[75] Inventor: Yuji Yaguchi, Ibaraki-ken, Japan

[73] Assignee: Texas Instruments Incorporated, Dallas, Tex.

[21] Appl. No.: 862,573

[22] Filed: May 23, 1997

Related U.S. Application Data

[62] Division of Ser. No. 487,195, Jun. 7, 1995, abandoned.

[30] Foreign Application Priority Data

Jan. 19, 1995 [JP] Japan .................................. 7-024748

[51] Int. Cl.⁶ .................................................. G06F 12/00
[52] U.S. Cl. ..................... 711/105; 711/106; 365/189.01; 365/189.07; 365/185.21; 365/185.13; 365/185.25; 365/203; 365/204
[58] Field of Search ........................ 395/200.3, 428–437; 365/189.01, 185.13, 185.25, 90, 130, 131, 133, 134, 140, 221, 222, 200, 202, 196, 203, 204, 205, 189.07, 189.09, 185.21; 711/100–110

[56] References Cited

U.S. PATENT DOCUMENTS

| | | | |
|---|---|---|---|
| 4,658,354 | 4/1987 | Nukiyama | 395/183.06 |
| 4,979,096 | 12/1990 | Ueda et al. | 395/200.19 |
| 5,093,722 | 3/1992 | Miyaguchi et al. | |
| 5,163,120 | 11/1992 | Childers et al. | |
| 5,222,229 | 6/1993 | Fukuda et al. | 395/200.19 |
| 5,383,160 | 1/1995 | Furuyama | 365/221 |
| 5,426,601 | 6/1995 | Agata et al. | 365/226 |
| 5,430,672 | 7/1995 | Kuwabara et al. | 365/149 |
| 5,448,716 | 9/1995 | Hardell, Jr. et al. | 395/200.19 |
| 5,515,312 | 5/1996 | Nakakuma et al. | 365/201 |
| 5,522,084 | 5/1996 | Ando | 395/800 |
| 5,532,965 | 7/1996 | Kenney | 365/200 |

FOREIGN PATENT DOCUMENTS

| | | |
|---|---|---|
| 90311268.8 | 10/1990 | European Pat. Off. . |
| 91303836.0 | 4/1991 | European Pat. Off. . |

OTHER PUBLICATIONS

Toru Baji, et al., "A 20–ns CMOS Micro–DSP Core for Video–Signal Processing," IEEE Journal of Solid–State Circuits, vol. 23, No. 5, Oct. 1, 1988, pp. 1203–1211.

Dongming Zhao, et al., "A Real–Time Column Array Processor Architecture for Images," IEEE Transactions on Circuits and Systems for Video Technology, vol. 2, No. 1, Mar. 1, 1992, pp. 38–48.

*Primary Examiner*—Meng-Ai T. An
*Assistant Examiner*—Ario Etienne
*Attorney, Agent, or Firm*—Gerald E. Laws; William B. Kempler; Richard L. Donaldson

[57] ABSTRACT

A method of reading a memory cell containing an access transistor, a word line and a memory storage for holding information. The access transistor having a control terminal is connected to the word line. The memory storage is connected to the access transistor and thereby to a sense amplifier through a bit line. The access transistor, operating in a conductive state, is responsive to the word line. The bit line is precharged to an intermediate voltage level greater than a low threshold level and less than an upper limit level. The bit line is discharged from the intermediate voltage level to produce a low voltage level in a prescribed time if the memory storage holds memory information of a first state. The bit line is charged to approximately the upper limit level in the prescribed time if the memory storage holds memory information of a second state. The voltage of the bit line is determined by the sense amplifier after the prescribed time so that the memory information is read.

10 Claims, 16 Drawing Sheets

METHOD FOR READING DATA IN A MEMORY CELL

This application is a Division of application Ser. No. 08/487,195, filed Jun. 7, 1995, now abandoned.

FIELD OF THE INVENTION

This invention pertains to a single-instruction multiple-data(SIMD) digital signal processing apparatus.

BACKGROUND OF THE INVENTION

In a SIMD digital signal processing apparatus, multiple processing elements are connected in parallel on a single chip, enabling all the processing elements to perform the same operation in response to a single program. It is used in image signal processing, data processing, etc.

For example, FIG. 16 shows the main portion of a SVP (scan-line video processor) for real-time processing of NTSC signals. This SVP has a three-layer structure made of data input register (DIR) 200, SIMD digital signal processing unit 202, and data output register (DOR) 204.

For DIR 200, the image data d1–dn corresponding to one horizontal scan line (e.g., 40 bits×960 words) are input repeatedly. In SIMD digital signal processing unit 202, processing elements pe1–pen with a number n equal to the number of pixels on a horizontal scan line (say, 960) are arranged in parallel (connection). Corresponding to the successive common instructions I from an instruction generating portion (not shown), these processing elements pe1, pe2, . . . pen execute the prescribed image processing operation for the corresponding pixel data d1, d2, . . . dn during one horizontal scanning period. In this way, image data d1–dn of one scan line are processed once. DOR 204 collects the operation processing results from processing elements pe1–pen to form image data d1–dn' (such as 24 bits×960 words) for one horizontal scan line. The data transfer from DIR 200 to processing unit 202 and data transfer from processing unit 202 from DOR 204 are carried out during the horizontal blanking period.

In this case, data input, parallel processing, and data output for each horizontal scan line are executed by processing DIR 200, unit 202, and DOR 204 in a pipeline scheme.

Each processing element PEk of processing unit 202 comprises a pair of register files, a 1-bit ALU (arithmetic logic unit), several working registers, and L/R communication unit for exchanging data with multiple left- and right-side neighboring processing elements (for example, 2 on each side). The register file on one side is connected to DIR 200, and it holds the data before and during operation. The register file on the other side is connected to DOR 204, and it holds the data during the operation and the data of the final operation result.

FIG. 17 shows the timing of the processing operation within each processing element PEk in the conventional SVP.

(1) First, 1-bit data is read from one and/or the other memory address of a pair of register files with address assigned by the corresponding instruction Ii (DATA READ).

(2) Then, the L/R communication unit performs conditional exchange of data with the left-side and right-side neighboring processing elements (e.g., two on each side) PEk-2, PEk-1, PEk+1, PEk+2, assigned by the corresponding instruction Ii (LRCOM).

(3) Then, ALU executes the operation as assigned by the corresponding instruction Ii for the data read in the steps (1), (2) and/or the received data (ALU).

(4) Finally, one set of the data obtained in the steps (1), (2), (3) is written into one and/or the other memory address of the pair of register files assigned by the corresponding instruction Ii (WRITE BACK).

In this way, during each clock cycle, four steps (1)–(4) are executed for performing 1-bit operation processing. For example, in the operation of 8-bit addition to obtain 9-bit output, 9 clock cycles are needed. For each of these clock cycles, the four steps (1)–(4) are executed.

As shown in FIG. 18, the register files in DIR 200, DOR 204, and processing element PEk are made of current-read-type DRAM (dynamic random access memory).

In the current-read-type DRAM of FIG. 18, memory node N of capacitor 206 that forms the memory cell is connected via write transistor 208 to write bit line WBL, and it is connected through memory cell transistor 210 and access transistor 212 to read bit line RBL. The gate terminal of write transistor 208 is connected to write word line WWL, and the gate terminal of access transistor 212 is connected to read word line RWL. Read bit line RBL is connected via precharge transistor 214 to the terminal of power source voltage VDD, and it is connected to input terminal 216a of single-ended sense amplifier 216 comprised of inverters.

In the write operation, write word line WWL is enabled, and write transistor 208 conducts, and 1-bit information of "1" (H-level) or "0" (L-level) is written from write bit line WBL to capacitor 206. When "1" (H-level) is stored in capacitor 206, NMOS type memory cell transistor 210 is on; when "0" (L-level) is stored, it is off.

FIG. 19 shows the waveforms of the various portions in the read operation and timing. First, as precharge control signal XPCHG becomes active (L-level), PMOS precharge transistor 214 conducts, and read bit line RBL is precharged to a voltage of the H-level near power source voltage VDD (e.g., 3 V). After end of the precharge, read word line RWL becomes active (H-level), and NMOS type active transistor 212 conducts.

When the information "1" is stored in capacitor 206, memory cell transistor 210 turns on. Then access transistor 212 conducts, and current flows from read bit line RBL through two transistors 212, 210. The voltage of RBL drops exponentially with time.

As the voltage of read bit line RBL falls below a prescribed threshold (such as 1.5 V), PMOS output transistor 218 of sense amplifier 216 turns on, and NMOS output transistor 222 turns off. In this case, read control signal READ is enabled (H-level), and NMOS read transistor 220 conducts. The "1" (H-level) read information (DATA) is read from output terminal 216b of sense amplifier 216.

When information "0" is stored in capacitor 206, memory cell transistor 210 turns off. Even when access transistor 212 conducts, the voltage of read bit line RBL is still maintained at the H-level. In sense amplifier 216, NMOS output transistor 222 is on, while PMOS output transistor 218 is maintained in the off state. In the prescribed timing, read control signal READ becomes active (H-level), and the NMOS type read transistor 220 conducts, so that "0" (L-level) read information (DATA) is obtained from output terminal 216b of sense amplifier 216.

As explained above, with the conventional SVP, in order to perform image signal processing with respect to 1-bit data, for each processing element PEk, it is necessary to perform four steps in each clock cycle, namely, (1) step in which data is read from the register file (DATA READ); (2)

step in which data is conditionally exchanged with multiple left-side and right-side neighboring processing elements (LRCOM); (3) step in which ALU performs operation for the data obtained in the steps (1) and (2); and (4) step in which one set of the data obtained in the steps (1), (2), (3) is written in the register file (WRITE BACK). These steps are executed in order.

However, as shown in FIG. 17, the actual processing time is short in steps (1)–(4) in each cycle, while most of the time is not used for processing.

For step (1) (DATA READ), immediately after the beginning of a cycle, the read operation of the register file is started; reading of the data is completed in the first part of the cycle, while the remaining time a (the intermediate part and latter part) becomes the time merely for holding the data.

In step (2) (LRCOM), nearly the time b1 of the first part of each cycle is the time for waiting for the data sent from the other processing elements on the left- and right-side neighbors, and the remaining time after the data is received in the intermediate portion of the cycle (latter part time of the cycle) b2 becomes the time merely for holding the received data.

In step (3) (ALU), time c1 corresponding to the first part and the intermediate part of the cycle is the time for waiting for the data in steps (1) and (2), while the remaining time c2 after execution of the operation in the latter part of the cycle is the time merely for holding the data of the operation results.

In step (4) (WRITE BACK), time d from the start of the cycle to end of step (3) is the time merely for waiting for the data of the operation results.

In this way, in each cycle, data waiting time, data holding time, and other nonprocessing times are attached to the actual processing time of various steps (1)–(4). So it is difficult to increase the throughput, which is a disadvantage.

Also, in the case of reading of current-read-type DRAM cell, in the conventional scheme, as shown in FIG. 19, the voltage level of read word line RWL varies with precharge control signal XPCHG. That is, during the period of precharge, XPCHG is in the active state (L-level), and RWL is in the nonactive state (L-level). At the end of precharge, XPCHG becomes the nonactive state (H-level), and, at the same time, RWL becomes the active state (H-level). In this way, the voltage of read bit line RBL falls conditionally (when the memory information is "1").

However, a certain time td is needed to have read word line RWL rise to the H-level. The discharge start time of RBL is delayed for this rise time td, and timing of detection of the sense amplifier is delayed.

Also, when the memory information is "1," the voltage of read bit line RBL oscillates between the upper threshold and lower threshold of the voltage logic as L-level (VSS: ground voltage) →H-level (VDD: 3 V) →L-level (VSS: ground potential). Thus the discharge time is prolonged in any case.

In this way, in the reading method of the conventional current-read-type DRAM cell, it is difficult to shorten the time period from the start of the read operation to the time point when the voltage of the logic level corresponding to the memory information of the cell on the read bit line RBL, and a the read access rate is limited.

The first purpose of this invention is to solve the problems of the conventional methods by providing an SIMD digital signal processing method and apparatus that can increase the number of cycles of operation that can be executed in unit time and to increase the throughput.

The second purpose of this invention is to provide a read method for the current read type memory cell for shortening the discharge time needed for the bit line and to increase the read rate.

SUMMARY OF INVENTION

A first digital signal processing method of this invention is a digital signal processing method in which: 1) multiple processing elements are arranged in parallel, and the same processing is executed in parallel for the multiple processing elements corresponding to each instruction; 2) Each of the processing elements has one or more memory means for storing the data before or after the operation, a communication means for exchanging data with a prescribed number of the processing elements as the neighboring processing elements, and an operation means for performing the prescribed operation for the data read from the memory means and/or the data received by the communication means; 3) for each instruction, the following steps are executed in order: a first step of reading data from the memory means, a second step in which the communication means makes conditional exchange with the prescribed number of the processing elements as the neighboring processing elements, a third step in which the prescribed operation is carried out using the operation means, and a fourth step in which one among the data obtained in the first, second, and third steps is written into the memory means; 4) for consecutive multiple instructions, at least two of the first, second, third and fourth steps are executed at the same time.

The second digital signal processing method of this invention is a digital signal processing method of the item 1 characterized by the fact that each of the the first, second, third and fourth steps is executed in one cycle, and, in each cycle, the first, second, third, and fourth steps are executed at the same time for 4 consecutive instructions, respectively.

The third digital signal processing method of this invention is a digital signal processing method of sid item 1 characterized by the following facts: the first and second steps are executed in one cycle, and the third and fourth steps are executed in one cycle; and, for two consecutive instructions, the first and second steps and the third and fourth steps are respectively executed at the same time.

The first digital signal processing apparatus of this invention is characterized by the following facts: the digital signal processing apparatus has multiple processing elements arranged in parallel, and the multiple processing elements are made to execute the same processing in parallel corresponding to each instruction; each of the processing elements comprises the following means: one or more memory means for holding the data before or after operation; a communication means for exchanging data with a prescribed number of the processing elements as the neighboring processing elements; an operation means which performs the prescribed operation for the data read from the memory means and/or the data received by the communication means; a first latch which has a data input terminal connected to the data output terminal of the memory means and a data output terminal connected to the data input terminal of the operation means, and which fetches, during the second cycle, the data read from the memory means in the first cycle; a second latch which has a data input terminal connected to the data output terminal of the first latch, and which fetches, during the third cycle after the second cycle, the data from the first latch; a third latch which has a data input terminal connected to the communication means, and which fetches, during the third cycle, the data conditionally fetched by the communication means from any one of the prescribed number of adjacent processing elements in the second cycle; and a fourth latch which has data input terminals connected to the data output means of the second and third latch and the data output terminal of the operation means, respectively, and data output terminals connected to the data input terminals of the memory means, and which, during the fourth cycle next to the third cycle, selectively fetches the data from the operation means, the data from the second latch, or the data from the second latch [sic]; in the fourth cycle, the data from the fourth latch is written to the memory means.

The second digital signal processing apparatus of this invention is a digital signal processing apparatus characterized by the following facts: the digital signal processing apparatus has multiple processing elements arranged in parallel, and the multiple processing elements are made to execute the same processing in parallel corresponding to each instruction; each of the processing elements comprises the following means: one or more memory means for holding the data before or after operation; a communication means for exchanging data with a prescribed number of the processing elements as the neighboring processing elements; an operation means which performs the prescribed operation for the data read from the memory means and/or the data received by the communication means; a first latch which has a data input terminal connected to the data output terminal of the memory means and a data output terminal connected to the data input terminal of the operation means, and which fetches, during the second cycle, the data read from the memory means in the first cycle; and a second latch which has a data input terminal connected to the data output terminal of the communication means, and a data output terminal connected to the data input terminal of the memory means, and which fetches, during the second cycle, the data conditionally received from any of the prescribed number of adjacent processing elements by the communication means in the first cycle; in the second cycle, the data from the operation means, the data from the first latch, or the data from the second latch are selectively written into the memory means.

The memory cell reading method of this invention is characterized by the following facts: in this current-read-type memory cell read method, the memory cell containing a transistor with the control terminal connected to the word line and a memory information holding unit for holding the memory information is connected to a sense amplifier through a bit line; when the transistor conducts, corresponding to the contents of the memory cell, current flows between the bit line and the transistor conditionally; the voltage of the bit line is determined by the sense amplifier so that the memory information is read; in this memory cell read method, with the transistor in the conductive state, the bit line is precharged for a prescribed time, and the voltage of the bit line is determined by the sense amplifier in a prescribed timing.

According to this invention, in each of the multiple processing elements that execute the same processing in parallel, the following four steps are executed in order: a first step in which data is read from the memory means; a second step in which the communication means performs exchange of data conditionally with a prescribed number of neighboring processing elements; a third step in which operation is performed by the operation means; and a fourth step in which any one set of the data obtained in the first, second, and third steps are written into the memory means. For the consecutive multiple instructions, at least two of these four steps are executed at the same time.

Each of the first, second, third, and fourth steps is executed in one cycle. For the four consecutive instructions, the first, second, third, and fourth steps are executed at the same time for them, respectively. In this way, for each instruction, it is possible to perform pipeline processing, to increase the number of operation processing cycles per unit time, and to increase the throughput.

According to the current-read-type memory cell read method of this invention, after precharge, when a current flows in the bit line and transistor for memory cell access corresponding to the memory information, the bit line is discharged through the transistor in the conductive state during the precharge process. At the end of the precharge, since the transistor is in the conductive state, the bit line can start the intrinsic discharge immediately from the intermediate-level voltage, and the discharge can be essentially completed in a short time. In this way, the sense amplifier operate after a short time interval from the end of precharge, and the read cycle can thus be shortened.

DETAILED DESCRIPTION OF EMBODIMENTS

Figure 1:
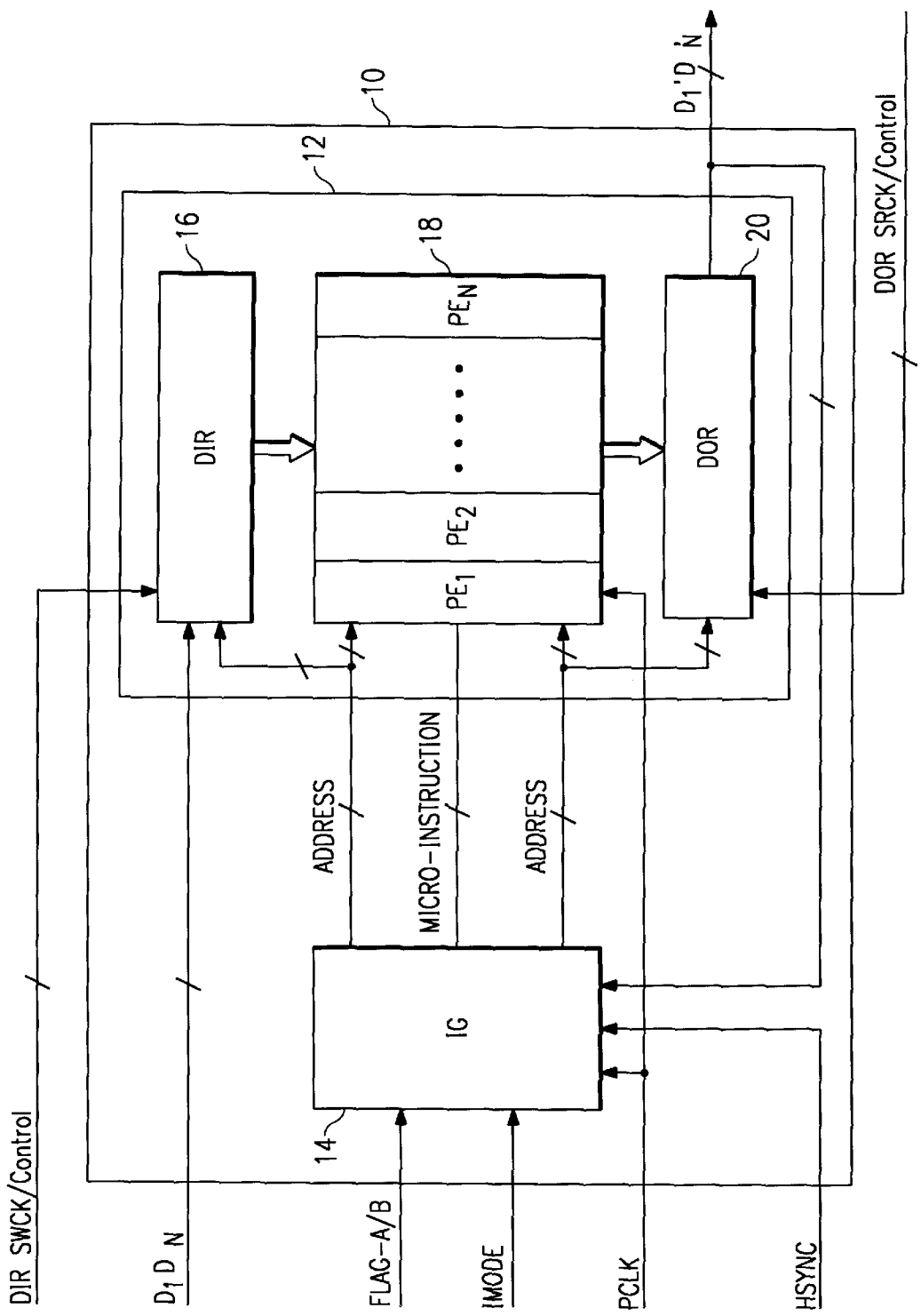
FIG. 1 is a block diagram of the configuration of SVP used in the SIMD digital signal processing apparatus in an embodiment of this invention.

FIG. 1 shows SVP appropriate for the SIMD digital signal processing apparatus of this invention.

The SVP 10 carries SVP core 12 and instruction generator (IG) 14 on a single chip. SVP core 12 has a three-layer configuration made of data input register (DIR) 16, SIMD digital signal processing unit 18, and data output register (DOR) 20.

For DIR 16, the operation is performed according to the control signal (Control) from an external control circuit, clock (SWCK) from an external clock circuit, and address (ADDRESS) from IG 14, and image data D1–DN corresponding to a horizontal scan line (such as 48 bits×1024 pixels) is input repeatedly.

In SIMD digital signal processing unit 18, processing elements PE1–PEN in a number equal to the number N of pixels on a horizontal scan line (such as 1024) are arranged (connected) in parallel. These processing elements PE1, PE2, . . . PEN perform parallel operation according to the instructions from IG 14, namely, address (ADDRESS) and microinstructions (MICROINSTRUCTION), and clock (PCLK) from the external clock circuit, and they perform, in a horizontal scanning period, the same image processing operation for the corresponding pixel data D1, D2, . . . DN, respectively.

DOR 20 performs operation according to the control signal (CONTROL) from the external control circuit, clock signal (SRCK) from the external clock circuit, and the address signal (ADDRESS) from IG14, and it sorts for output the image data D1'–DN' (such as 32 bits×1024 pixels) corresponding to a horizontal scan line for the data of the results of operation from processing elements PE1–PEN in each horizontal period.

Clock signals (SWCK), (PCLK), and (SRCK) fed to DIR 16, processing unit 18, and DOR 20 are asynchronous to each other. Also, data transfer from DIR 16 to processing unit 18 and data transfer from processing unit 18 to DOR 20 are carried out during the horizontal blanking period.

In this way, real-time image processing is carried out as data from one horizontal scan line input from DIR 16, processing unit 18, and DOR 20, is parallel processed, and data output is executed asynchronously in parallel.

IG 14 contains program memory and various other registers. It performs jump, subroutines, interrupts, and other operations according to the flag signal (FLAG-A/B) and instruction mode signal (IMODE) sent from the outside.

Figure 2A:
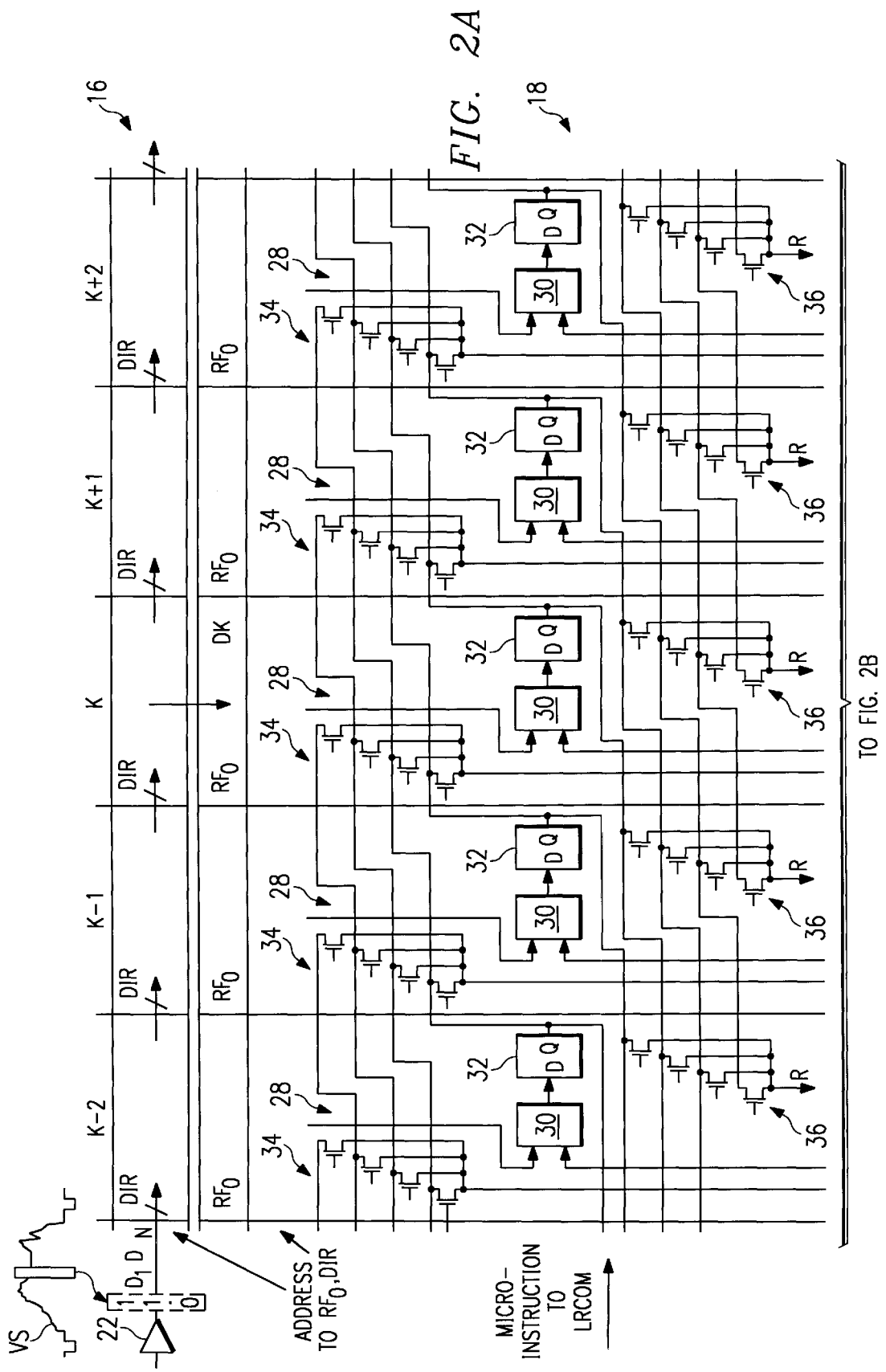
FIG. 2 is a schematic diagram of the function of the SVP in the embodiment.
Figure 2B:
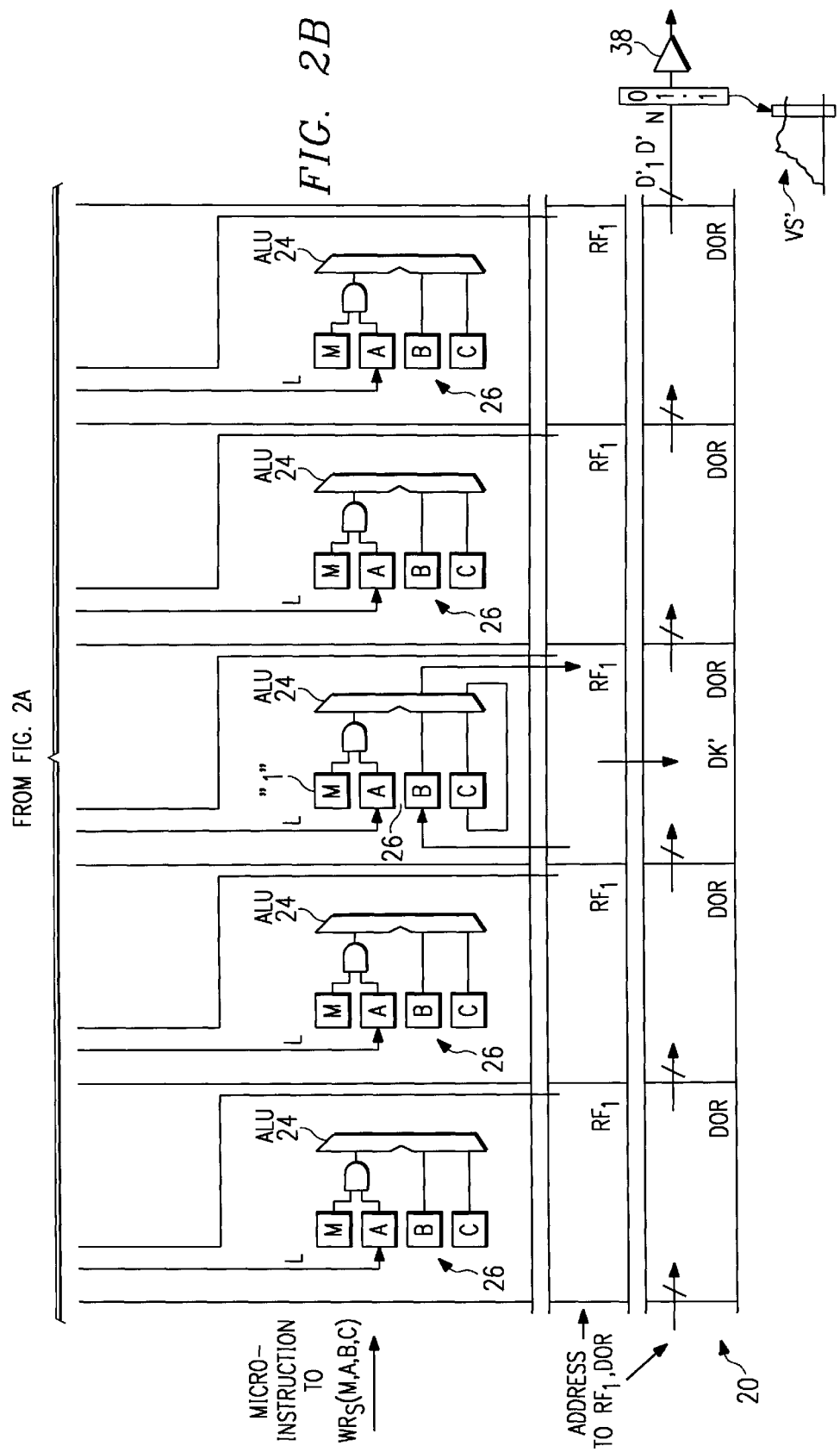

Here, the function of the SVP core 12 can be explained briefly with reference to FIG. 2. The operations of the various portions in SVP core 12 are performed under control by the address signal (ADDRESS) and microinstruction (MICROINSTRUCTION) from IG 14, and the clock signal (PCLK) from the external clock circuit. The clock signal (PCLK) sent to digital signal processing unit 18 is at a higher rate (e.g., four times) than that of the conventional processing unit 202.

As shown in FIG. 2, for example, the analog video signal VS demodulated by the demodulator in the preceding stage is converted to a 32-bit 36-MHz digital video signal by means of A/D converter 22. Then, after adding (synthesizing) 16-bit video adjusting data from a video adjustment circuit (not shown) on the side of the video receiver to the digital video signal, the digital video signal corresponding to one line is generated as input image data D1–DN (48 bits×1024 pixels) for each horizontal scan period.

DIR 16 has a capacity (48 bits×1024 words) equal to the bit number and pixel number of the input image data D1–DN for one line, and it is divided into blocks in the pixel units. For the various blocks of DIR 16, . . . K–2, K–1, K, K+1, K+2 . . . , input image data D1–DN is loaded into the register groups during the process of transfer of the input image data into DIR 16, while various pixel data . . . DK–2, DK–1, DK, DK+1, DK+2 . . . is transferred down one-by-one (48 bits).

Each processing element PEk of processing unit 18 comprises the following parts: a pair of register files RF0, RF1 of prescribed capacity (e.g., 192 bits), one 1-bit operation arithmetic logic unit (ALU) 24, multiple (e.g., 4) working registers WRs (M, A, B, C) 26, and multiple left-side and right-side neighboring (4 on each side) processing elements (PEk–4, PEk–3, PEk–2, PEk–1, PEk+1, PEk+2, PEk+3, PEk+4), and L/R (left/right) communication unit (LRCOM) 28 for exchanging data.

The register file RF0 on one side is connected to the register group of the corresponding block of DIR 16, while the register RF1 on the other side is connected to the register group corresponding to DOR 20. The 1-bit information from one or both of register files RF0, RF1 is sent to one of working registers (M, A, B, C), and, at the same time, it is sent to the neighboring processing elements, 4 on each side, through multiplexer 30 and latch circuit 32 of L/R communication unit 28 (PEk–4, PEk–3, PEk–2, PEk–1, PEk+1, PEk+2, PEk+3, PEk+4).

At the same time, the data from the neighboring processing elements (PEk–4, PEk–3, PEk–2, PEk–1, PEk+1, PEk+2, PEk+3, PEk+4) is sent to multiplexers 34, 36 of L/R communication unit 28 of the processing element PEk, and one set of data is selected from this data and is input to one of working registers (M, A, B, C). FIG. 2 shows the configuration in which one set of data is selected from the data from the left-side neighboring processing elements (PEk–4, PEk–3, PEk–2, PEk–1), and is input to working register (A).

ALU 24 performs the desired operation for the data sent from working registers (M, A, B, C), and outputs the result of the operation. The data of the result of operation of ALU 24 is written into one of register files RF0 and RF1. In this way, the data of the final operation result in each horizontal scanning period is written as pixel data DK' of the final operation processing result to register file RF1 on the output side, and, during the following horizontal blanking period, the data is transferred from the register file RF1 to the register in the block corresponding to DOR 20.

DOR 20 has a capacity (32 bits×1024 words) equal to the bit number and pixel number of the output image data D1'–DN', and is divided into blocks in the pixel units. Pixel data D1'–DN' as the operation processing result sent from processing unit 18 to DOR 20 for each block is sent from the various blocks of DOR 20 in sequence, wherein the left-end pixel data D1' during a horizontal scanning period is the front, followed by the following pixel data D2', D3', . . . in a consecutive manner.

Image data D1'–DN' of one line output from DOR 20 is converted back to analog video signals by means of D/A converter 38, and the data is then sent in this form to a video circuit (not shown).

Figure 3:
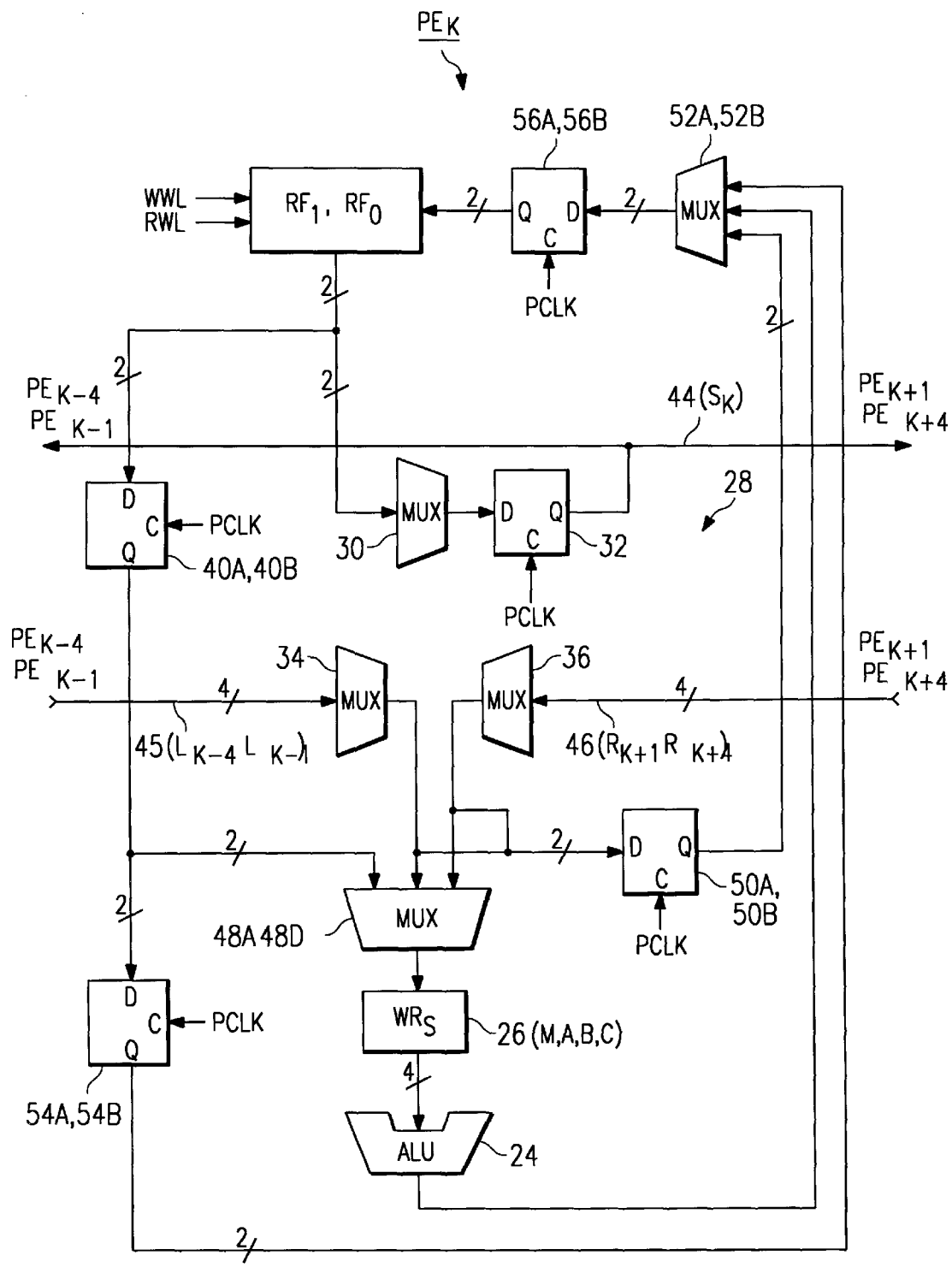
FIG. 3 is a block diagram of the basic configuration of the processing element in the SVP in the embodiment.

FIG. 3 is a block diagram of the basic configuration of each processing element PEk in this embodiment.

The output terminals of two register files RF0 and RF1 are connected to the input terminals of transmission multiplexer 30 of L/R communication unit 28, and they are also respectively connected to data input terminals (D) of first latch circuits 40A, 40B for holding the corresponding read data.

In L/R communication unit 28, the output terminal of transmission multiplexer 30 is connected to data input terminal (D) of transmission latch circuit 32, and data output terminal (Q) of latch circuit 32 is connected to 1-bit data line 44 (SK). Also, the input terminals of left-side neighboring receiving multiplexer 34 are connected via 4-bit left-side neighboring data lines 45 (LK−4, LK−3, LK−2, LK−1) to the data output terminals (Q) of transmission latch circuit 32 of the four left-side neighboring processing elements (PEk−4, PEk−3, PEk−2, PEk−1), respectively. Similarly, the input terminals of right-side neighboring receiving multiplexer 36 are connected via 4-bit right-side neighboring data lines 46 (RK+4, RK+3, RK+2, RK+1) to the data output terminals (Q) of transmission latch circuit 32 of the four right-side neighboring processing elements (PEk+1, PEk+2, PEk+3, PEk+4), respectively.

Also, the transmission data line (SK) in the processing element PEi may be one (RK+1) of the right-side neighboring data lines 46 for data reception in one [sic; the first] left-side neighboring processing element PEk−1, and, at the same time, it may also be one (LK−2) of the left-side neighboring data lines 44 for data reception in two [sic; the second] right-side neighboring processing elements PEk+2.

The output terminals of two receiving multiplexers 34, 36 are connected to the input terminals of four operation data selection multiplexers 48A–48D, and they are also connected to data input terminals (D) of the corresponding received data holding latch circuits 50A, 50B. Data output terminals (Q) of the latch circuits 50A, 50B are connected to the input terminals of written data selection multiplexers 52A, 52B arranged in two register files RF0 and RF1, respectively.

The output terminals (Q) of the read-data-holding first latch circuits 40A, 40B are connected to the input terminals of the operation data selection multiplexers 48A–48D, and they are also connected to data input terminals (D) of the corresponding read-data-holding second latch circuits 54A, 54B. Data output terminals (Q) of the latch circuits 54A, 54B are connected to the input terminals of written data selection multiplexers 52A, 52B, respectively.

The output terminals of operation data selection multiplexers 48A–48D are connected to the input terminals of corresponding registers M, A, B, C of working registers (WRs) 26. The output terminals of these working registers M, A, B, C are connected to the input terminals of ALU 24, and the output terminals of ALU 24 are connected to the input terminals of write data selection multiplexers 52A, 52B. The output terminals of these multiplexers 52A, 52B are connected to data input terminals (D) of the corresponding write data holding latch circuits 56A, 56B. Data output terminals (Q) of these latch circuits 56A, 56B are connected to the data input terminals of register files RF0 and RF1, respectively.

The latch circuits 32, 40A, 40B, 50A, 50B, 54A, 54B, 56A, 56B in each processing element PEk are made of D flip-flops. A common clock PCLK is fed to clock input terminal (C) of each of these D flip-flops. Also, each of multiplexers 30, 34, 36, 48A–48D, 52A, 52B is controlled by the microinstruction from IG 14.

Figure 4:
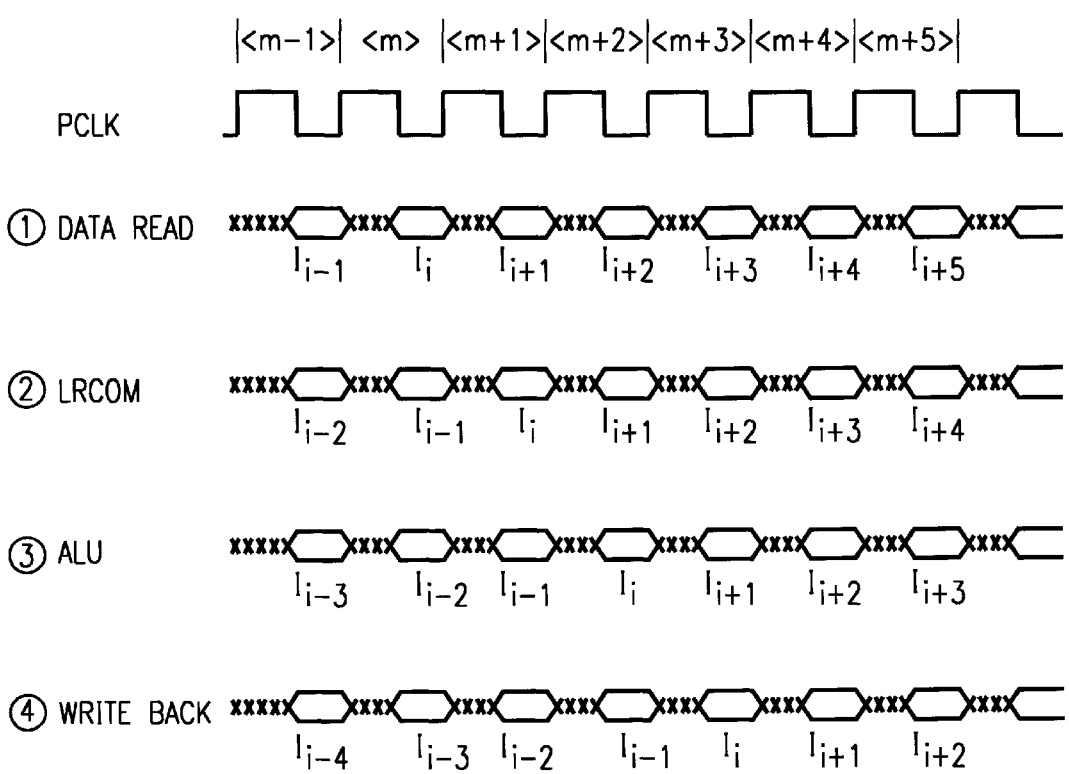
FIG. 4 is a timing chart of the timing of the various processing operations in a processing element in the embodiment.

FIG. 4 shows the timing of processing operation of each step executed at each processing element PEk corresponding to the series of instructions . . . Ii−1, Ii, Ii+1 . . . fetched by IG 14.

The operation processing performed with respect to one instruction Ii issued from IG 14 is executed by the following four consecutive clock cycles <m>, <m+1>, <m+2>, <m+3>.

(1) First, in the first cycle <m>, the 1-bit data is read from one memory address and/or the other memory address of register files RF0 and RF1 with address assigned by the instruction Ii (DATA READ).

(2) Then, in the second cycle <m+1>, one set of the data read from register files RF0 and RF1 in the first cycle <m> is fetched through transmission multiplexer 30 of L/R communication unit 28 to transmission latch circuit 32, and the data is sent from its data output terminal (Q) to four processing elements on each of the left-side and right-side neighbor (PEk−4, PEk−3, PEk−2, PEk−1, PEk+1, PEk+2, PEk+3, PEk+4) through data line 44 (SK).

At the same time, the data from the left-side and right-side neighboring processing elements, 4 on each side, (PEk−4, PEk−3, PEk−2, PEk−1, PEk+1, PEk+2, PEk+3, PEk+4) is sent through data lines 45 (LK−4 to LK−1), 46 (RK+1 to RK+4) and is input to the left-side and right-side neighboring multiplexers 34, 36. In each of multiplexers 34, 36, one set of received data is conditionally selected. The selected received data is sent to data input terminals (D) of received data holding latch circuits 50A and 50, and is input to operation data selection multiplexers 48A–48D (LRCOM).

On the other hand, the data read from register files RF0 and RF1 is fetched to read-data-holding first latch circuits 40A and 40B, respectively. The fetched read data to these latch circuits 40A and 40B is sent to data input terminals (D) of read-data-holding second latch circuits 54A and 54B, and, at the same time, they are input to operation data selection multiplexers 48A–48D. Each of multiplexers 48A–48D selects one set of the data and sends it to the input terminal of the corresponding working registers (M, A, B, C).

(3) Then, in the third cycle <m+2>, the data from operation data selection multiplexers 48A–48D is fetched to working registers (M, A, B, C), and the prescribed operation (ALU) is performed for this data in ALU 24.

The data of the operation results obtained in ALU 24 is input to write data selection multiplexers 52A and 52B.

On the other hand, the received data from receiving multiplexers 34 and 36 is fetched to received data holding latch circuits 50A and 50B, and, at the same time, the read data from first latch circuits 40A and 40B is fetched to read-data-holding second latch circuits 54A and 54B. The data fetched to these latch circuits 50A, 50B, 54A, 54B is input from their respective output terminals (Q) to write data selection multiplexers 52A and 52B.

Multiplexers 52A and 52B select one set of data from the input data and send it to data input terminals (D) of write data holding latch circuits 56A and 56B.

(4) Finally, in the fourth cycle <m+3>, the data from multiplexers 52A and 52B is fetched to write data holding latch circuits 56A and 56B, and the data is written into the memory addresses of register files RF0 and RF1 assigned by the instruction Ii (WRITE BACK).

In this way, in each processing element PEk in this embodiment, for the operation processing of each bit, four steps (1)–(4) are executed corresponding to four consecutive clock cycles <m>, <m+1>, <m+2>, <m+3>. Since the speed of clock PCLK is four times the speed of clock in the conventional processing element PEk, the time of four cycles is equal to the time of one cycle in the conventional case. This means that the operation processing time for 1 bit, that is, for 1 instruction, is the same as that of the conventional case.

However, in this embodiment, in each processing element PEk, as shown in FIG. 4, four steps (1)–(4) are executed with respect to their respective instructions in each cycle defined by clock PCLK at a speed four times the speed in the conventional case. The output rate of the operation processing, that is, the throughput, becomes four times the conventional rate.

In the following, the processing operation with respect to the instructions in the first cycle <m>through the fourth cycle <m+3>in various portions of FIG. 3 will be explained.

As explained above, register files RF0 and RF1 perform read operation with respect to instruction Ii during the first cycle <m>. The data read in the first cycle <m>is fetched into transmission latch circuit 32 and read-data-holding first latch circuits 40A and 40B at the rising edge of clock signal PCLK at the start of the second cycle <m+1>. In this way, register files RF0 and RF1 perform the read operation with respect to the next instruction Ii+1 during the second cycle <m+1>. Similarly, in the third cycle <m+2>, a read operation is performed with respect to instruction Ii+2, and, in the fourth cycle <m+3>, a read operation is performed with respect to instruction Ii+3.

Transmission latch circuit 32 fetches the data read from register files RF0 and RF1 at the rising edge of clock PCLK at the start of the next cycle, and the data is sent to the other neighboring processing elements.

In the first cycle <m>, the data assigned by instruction Ii−1, that is, the data read from register files RF0 and RF1 during the preceding cycle <m−1>, is read and sent. In the cycle <m+1>, as explained in above, the data assigned by instruction Ii, that is, the data read from register files RF0 and RF1 during the preceding cycle <m>, is read and sent. Similarly, in the third cycle <m+2>, the data assigned by instruction Ii+1, that is, the data read from register files RF0 and RF1 during the second cycle <m+1>, is read and sent; and in the fourth cycle <m+3>, the data assigned by instruction Ii+2, that is, the data read from register files RF0 and RF1 during the third cycle <m+2>, is read and sent.

Receiving multiplexers 34, 36 receive data from transmission latch circuits 32 of the neighboring four processing elements on each side (PEk−4, PEk−3, PEk−2, PEk−1, PEk+1, PEk+2, PEk+3, PEk+4), and select one of the data elements received. The operation is in synchronization to the operation of transmission latch circuit 32 in the processing element PEk.

In the first cycle <m>, one of the data elements (the data assigned by instruction Ii−1) read from register files RF0 and RF1 of the other neighboring processing elements in the preceding cycle <m−1>is received/selected. In the second cycle <m+1>, as explained above, one of the data (the data assigned by instruction Ii) read from register files RF0 and RF1 of the other neighboring processing elements in the preceding cycle <m>is received/selected. In the third cycle <m+2>, one of the data elements (the data assigned by instruction Ii+1) read from register files RF0 and RF1 of the other neighboring processing elements in the second cycle <m+1>is received/selected. In the fourth cycle <m+3>, one of the data elements (the data assigned by instruction Ii+2) read from register files RF0 and RF1 of the other neighboring processing elements in the third cycle <m+2>is received/selected.

The read-data-holding first latch circuits 40A and 40B fetch the data from register files RF0 and RF1 at the rising edge of clock signal PCLK at the start of each cycle (that is, the data read from RF0 and RF1 in the preceding cycle).

In the first cycle <m>, the data read from register files RF0 and RF1 in the preceding cycle <m−1>(the data assigned by instruction Ii−1) is fetched. In the second cycle <m+1>, the data read from register files RF0 and RF1 in the preceding cycle <m>(the data assigned by instruction Ii) is fetched. In the third cycle <m+2>, the data read from register files RF0 and RF1 in the second cycle <m+1>(the data assigned by instruction Ii+1) is fetched. In the fourth cycle <m+3>, the data read from register files RF0 and RF1 in the third cycle <m+2>(the data assigned by instruction Ii+1 [sic; Ii+2]) is fetched.

ALU 24 executes the prescribed operation in the cycle for the data fetched into working registers 26 (M, A, B, C) at the start of each cycle, and outputs the operation results. In working registers 26 (M, A, B, C), the data fetched into read-data-holding first latch circuits 40A and 40B in the preceding cycle and the data received by receiving multiplexers 34 and 36 is fetched.

At start of first cycle <m>, the data fetched into latch circuits 40A and 40B in the preceding cycle <m−1>(the data assigned by instruction Ii−2 in the corresponding processing element PEk) and the data received by multiplexers 34 and 36 (the data assigned by instruction Ii−2 in one of the neighboring processing elements, 4 on each side) is fetched into working registers 26 (M, A, B, C).

During the first cycle <m>, ALU 24 executes operation for the data fetched into working registers 26 (M, A, B, C) (the data assigned by instruction Ii−2), and the operation result is output.

Similarly, during the second cycle <m+1>, ALU 24 executes operation for the data assigned by instruction Ii−1, and the operation result is output; during the third cycle <m+2>, it executes operation for the data assigned by instruction Ii, and the operation result is output; and during the fourth cycle <m+3>, it executes operation for the data assigned by instruction Ii+1, and the operation result is output.

The read-data-holding second latch circuits 54A and 54B fetch the data fetched into first latch circuits 40A and 40B in the preceding cycle, that is, the data read from register files RF0 and RF1 two cycles ago, at the rising edge of clock signal PCLK at the start of each cycle.

In the first cycle <m>, the data read from register files RF0 and RF1 in the cycle <m−2>two cycles ago (the data assigned by instruction Ii−2) is fetched. In the second cycle <m+1>, the data read from register files RF0 and RF1 in the cycle <m−1>two cycles ago (the data assigned by instruction Ii−1) is fetched. In the third cycle <m+2>, the data read from register files RF0 and RF1 in the cycle <m>two cycles ago (the data assigned by instruction Ii) is fetched. In the same way, in the fourth cycle <m+3>, the data read from register files RF0 and RF1 in the second cycle <m+1>two cycles ago (the data assigned by instruction Ii+1) is fetched.

With the rising edge of clock PCLK in start of each cycle, received-data-holding latch circuits 50A and 50B fetch the data received by receiving multiplexers 34, 36 in the previous cycle, that is, the data read from register files RF0 and RF1 in any processing element from the neighboring processing elements two cycles ago, 4 on each side, (PEk−4, PEk−3, PEk−2, PEk−1, PEk+1, PEk+2, PEk+4).

In the first cycle <m>, received-data-holding latch circuits 50A and 50B fetch the data read from register files RF0 and RF1 in any of the neighboring processing elements, 4 on each side, (data assigned by instruction Ii−2) during the cycle <m−2>two cycles ago. In the second cycle <m+1>, [received-data-holding latch circuits 50A and 50B] fetch the data read from register files RF0 and RF1 in any of the neighboring processing elements, 4 on each side, (data assigned by instruction Ii−1) during the cycle <m−1>two cycles ago. In the third cycle <m+2>, [received-data-holding latch circuits 50A and 50B] fetch the data read from register files RF0 and RF1 in any of the neighboring processing elements, 4 on each side, (data assigned by instruction Ii) during the first cycle <m>two cycles ago. Similarly, in the fourth cycle <m+3>, [received-data-holding latch circuits 50A and 50B] fetch the data read from register files RF0 and RF1 in any of the neighboring processing elements, 4 on each side, (data assigned by instruction Ii+1) during the cycle <m+1>two cycles ago.

With the rising edge of clock PCLK in start of each cycle, write-data-holding latch circuits 56A and 56B fetch one of the data (the selected data) sent from data-selecting multiplexers 34 and 36 from ALU 24, read-data-holding second latch circuit 54A and 54B, and received-data-holding latch circuits 50A and 50B in the preceding cycle. The fetched data is written into register files RF0 and RF1 during this cycle period.

In the first cycle <m>, write-data-holding latch circuits 56A and 56B fetch any of the following data: the data of results of operation assigned by instruction Ii−3 (data from ALU 24), the read data assigned by instruction Ii−3 in the processing element PEk (data from latch circuits 54A and 54B), and the data assigned by instruction Ii−3 in any of the neighboring processing elements, 4 on each side (data from latch circuits 50A and 50B).

In the second cycle <m+1>, [write-data-holding latch circuits 56A and 56B] fetch any of the following data: the data of results of operation assigned by instruction Ii−2 (data from ALU 24), the read data assigned by instruction Ii−2 in the processing element PEk (data from latch circuits 54A and 54B), and the data assigned by instruction Ii−2 in any of the neighboring processing elements, 4 on each side (data from latch circuits 50A and 50B).

In the third cycle <m+2>, [write-data-holding latch circuits 56A and 56B] fetch any of the following data: the data of results of operation assigned by instruction Ii−1 (data from ALU 24), the read data assigned by instruction Ii−1 in the processing element PEk (data from latch circuits 54A and 54B), and the data assigned by instruction Ii−1 in any of the neighboring processing elements, 4 on each side (data from latch circuits 50A and 50B).

In the fourth cycle <m+3>, [write-data-holding latch circuits 56A and 56B] fetch any of the following data: the data of results of operation assigned by instruction Ii (data from ALU 24), the read data assigned by instruction Ii in the processing element PEk (data from latch circuits 54A and 54B), and the data assigned by instruction Ii in any of the neighboring processing elements, 4 on each side (data from latch circuits 50A and 50B).

In each cycle period, the microinstructions sent from IG 14 to each processing element PEk correspond to the multiple instructions. For example, for the third cycle <m+2>, a microinstruction corresponding to instruction Ii+2 is sent to files RF0 and RF1; a microinstruction corresponding to instruction Ii+1 is sent to receiving multiplexers 34 and 36; a microinstruction corresponding to instruction Ii is sent to operation data selecting multiplexers 48A–48D; and a microinstruction corresponding to instruction Ii−1 is sent to write-data selection multiplexers 52A and 52B.

In this way, in each processing element PEk in this embodiment, for each instruction Ii, four steps (1)–(4) are executed in order, with one step for each cycle, and, for each of four consecutive instructions (such as instructions Ii+2, Ii+1, Ii, Ii−1 in the third cycle <m+2>of FIG. 4), the four steps (1)–(4) are executed at the same time. As a result, in each processing element PEk, pipeline processing is carried out for the multiple instructions, so that the number of the operation cycles that can be executed per unit time or in each horizontal scanning period can be quadrupled.

FIGS. 5–8 are diagrams illustrating specific examples of the circuit configuration of each block K in SVP core 12 containing each processing element PEk. In these figs., the same symbols are assigned for the parts corresponding to the parts in FIG. 3.

Figure 5:
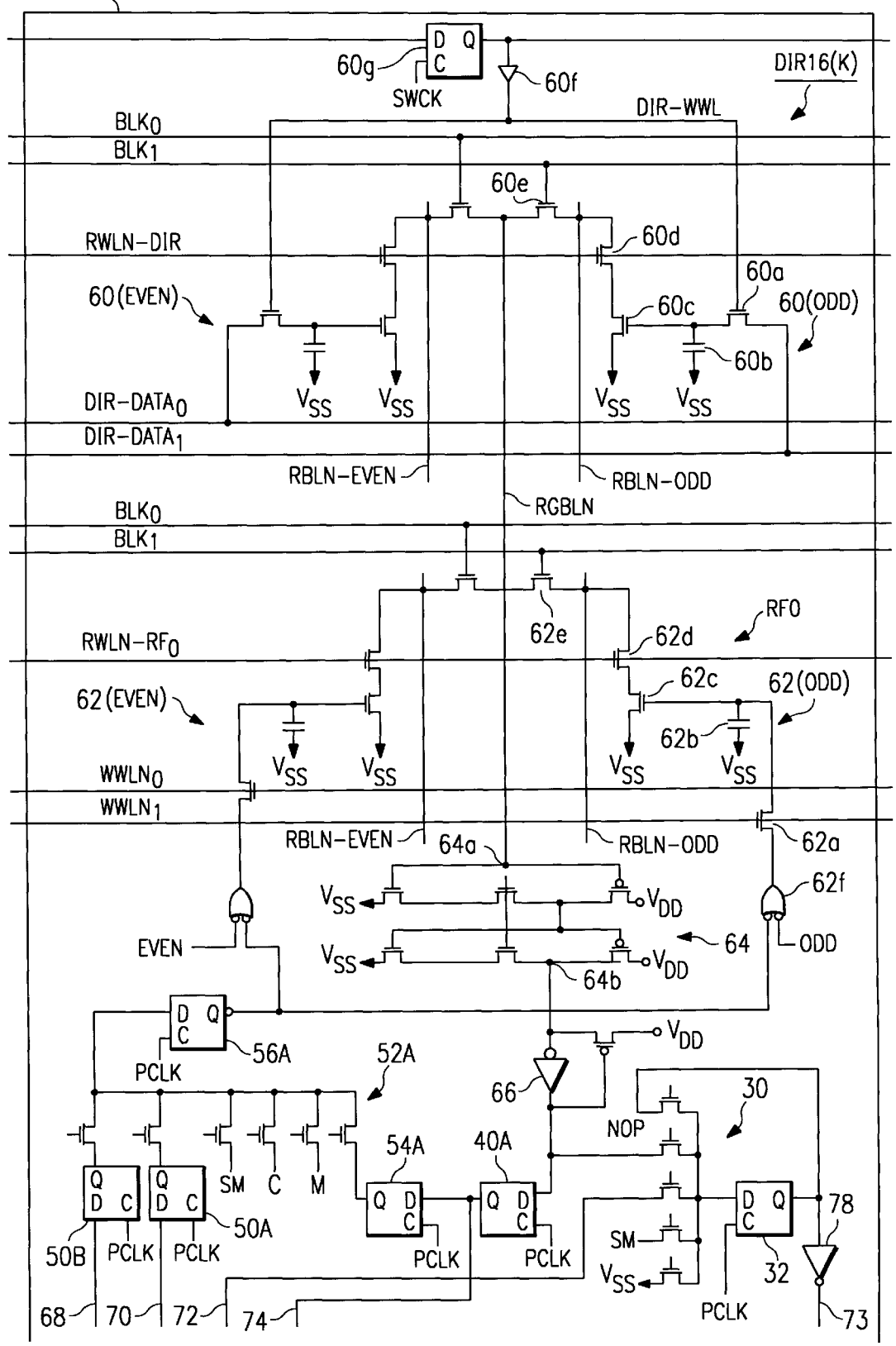
FIG. 5 is a circuit diagram of the specific configuration of each block of SVP containing the processing elements in the embodiment.

In FIG. 5, each block (K) of DIR 16 is made of multiply connected sections, with each section made of a pair (even-numbered side, odd-numbered side) of current-read-type DRAM cells 60 (even) and 60 (odd), and with a prescribed number of sections (24 sections when each pixel has 48 bits.) The read bit lines on the even-numbered side (RBLN-EVEN) and those on the odd-numbered side (RBLN-ODD) are connected through block selecting transistors 60e to read global bit line (RGBLN). The gate terminal of write transistor 60a of each of DRAM cell (60 EVEN) and 60 (ODD) is connected to the output terminal of buffer 60f via write word line (DIR-WWL). Buffer 60a and latch circuit 60g form a pointer for activating the input of the pixel data to the block (pull-down).

In synchronization with clock SWCK, the pointer data of "1" are transferred in order from the left-side block to the various pointers. When pointer data of "1" is fetched into latch circuit 60g of the block (K), write word line (DIR-WWL) becomes active, and the write transistors 60a of various DRAM cells (60 EVEN) and (60 ODD) conduct, and the corresponding pixel data Dk sent on write bit lines (DIR-DATA0) and (DIR-DATA1) is written via write transistor 60a to capacitor 60b of each cell, 1 bit at a time. Cell transistor 60c of each cell turns on/off corresponding to the contents of the memory information written in capacitor 60b.

The reading global bit line (RGBLN) is connected to input terminal 64a of sense amplifier 64. In the case of a read operation, upon the microinstruction from IG 14, one of block-reading word lines (BLK0) and (BLK1) becomes active, and the block selection transistor 60e on the odd-numbered side or even-numbered side conducts, and active transistor 60d of the cell on the odd-numbered side or even-numbered side also conducts by the reading word lines (RWLN-DIR) being active. In this way, through block selection transistor 60e on the conducting side, reading global bit line (RGBLN) is connected to the read bit line on the even-numbered side (RBLN-EVEN) or the odd-numbered side (RBLN-ODD). In addition, as access transistor 60d having a common gate input on the even-numbered side and odd-numbered side conducts, the memory information of the cell is read out on reading global bit line (RGBLN).

For one register file RF0 of each processing element PEk, multiple stages with a prescribed number of stages (e.g., 96 stages) are connected to each other, with each stage made of a pair (even-numbered side, odd-numbered side) current-read-type DRAM cells (62, EVEN) and (62, ODD). Even-numbered-side and odd-numbered-side read bit lines (RBLN-EVEN) and (RBLN-ODD) in register file RF0 are connected to reading global bit line (RGBLN), which is shared with DIR 16, through the respective block selection transistor 62e.

The gate terminals of transistors 62a of DRAM cells (62 EVEN) and (62 ODD) are connected to IG 14 through write word lines (WWLN0), (WWLN1). Through NAND circuit 62f, the data output terminal of write-data-holding latch circuit 56A is connected to the drain or source terminal (data input terminal) of each write transistor 62a. A control signal for conditionally controlling the write data on the odd-numbered side or even-numbered side or a micro instruction (EVEN), (ODD) is sent to one input terminal of NAND circuit 62f.

When write word lines (WWLN0) and (WWLN1) become active due to the microinstruction from IG 14, write transistor 62a conducts, and the data from latch circuit 56A is written through NAND circuit 62f and write transistor 62a to capacitor 62b.

During the read operation, one of block read word lines (BLK0) and (BLK1) becomes active due to the microinstruction from IG 14, block selection transistor 62e on the even-numbered side or on the odd-numbered side becomes conduct. Also, read word line (RWLN-RF0) becomes active, and access transistor 62d of the cell on the odd-numbered side or even-numbered side conducts. In this way, through block selection transistor 62e on the conducting side, read global bit line (RGBLN) is connected to the read bit line on the even-numbered side or odd-numbered side (RBLN-EVEN), (RBLN-ODD). In addition, since access transistor having a common gate input for the even-numbered side and odd-numbered side conducts, the memory information of the cell is read on read global bit line (RGBLN).

Output terminal 64b of sense amplifier 64 is connected to data input terminal (D) of read-data-holding first latch circuit 40A and one of the input terminals of transmission multiplexer 30 of LR communication unit 28 through buffer 66.

Each of transmission multiplexer 30 is made of multiple, e.g., 5, NMOS transistors controlled by the microinstruction. In this example, the configuration is appropriately arranged to ensure that the following data can be selectively input: the read data from one register file RF0, the read data sent through line 72 from the other register file RF1 (FIG. 8), the data from data output terminal (Q) of transmission latch circuit 32, the data of the sum output (SM) from the output terminal of ALU 24 (FIG. 7), and the data of "0" from power source terminal VSS.

Figure 6:
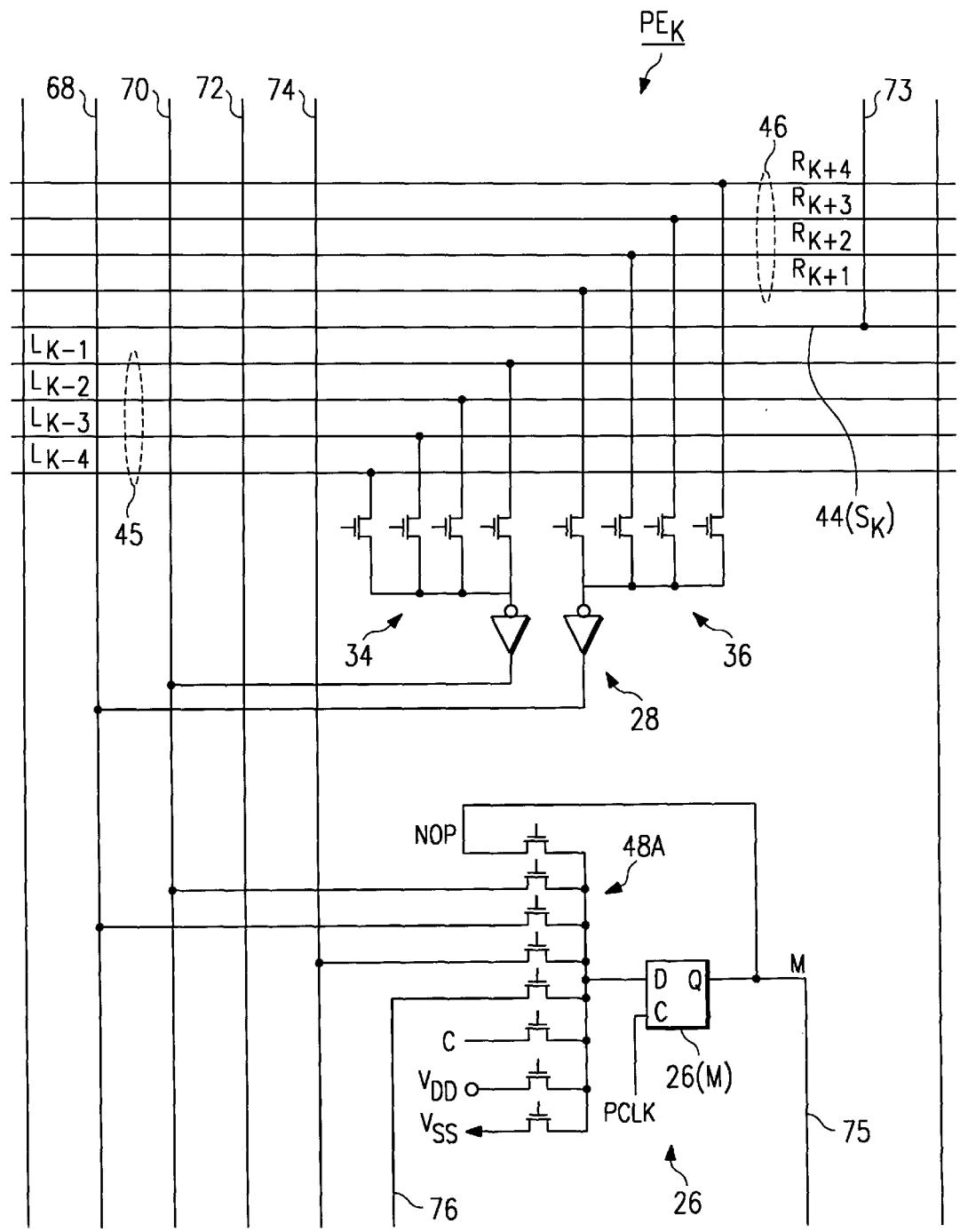
FIG. 6 is a circuit diagram of the specific configuration of each block of SVP containing the processing elements in the embodiment.

Data output terminal (Q) of transmission latch circuit 32 is connected to data line (44 SK) through buffer 78 and wiring 73 (FIG. 6).

Data output terminal (Q) of read-data-holding first latch circuit 40A is connected to data input terminal (D) of the second latch circuit 54A in the next stage, and, at the same time, it is connected to one input terminal of each of operation-data-selection multiplexers 48A–48D (FIGS. 6 and 7) through line 74.

The data output terminal (Q) of read-data-holding second latch circuit 54A is connected to one of the input terminals of write-data-selection multiplexers 52A.

Multiplexer 52A comprises multiple (say, 6) NMOS transistors controlled by microinstructions, respectively. In this example, the configuration is appropriate to ensure selective input of the following data: the data from data output terminal (Q) of latch circuit 54A, the data sent receiving multiplexers 34 and 36 of LR communication unit 28 through lines 70 and 68, the data of sum output (SM) from the output terminal of ALU 24, and the data from the first and fourth registers 26 (M) and 26(C) (FIGS. 6 and 7) of working register 26.

As shown in FIG. 6, receiving multiplexers 34 as the left neighbor of LR communication unit 28 are connected to left-side neighboring data lines 45 (LK−4, LK−3, LK−2, LK−1), respectively, and each of them is made of four NMOS transistors controlled by microinstructions. Receiving multiplexers 36 as the right neighbor are connected to right-side neighboring data lines 46 (RK+1, RK+2, RK+3, RK+4), respectively, and each of them is made of four NMOS type transistors controlled by microinstructions.

Figure 7:
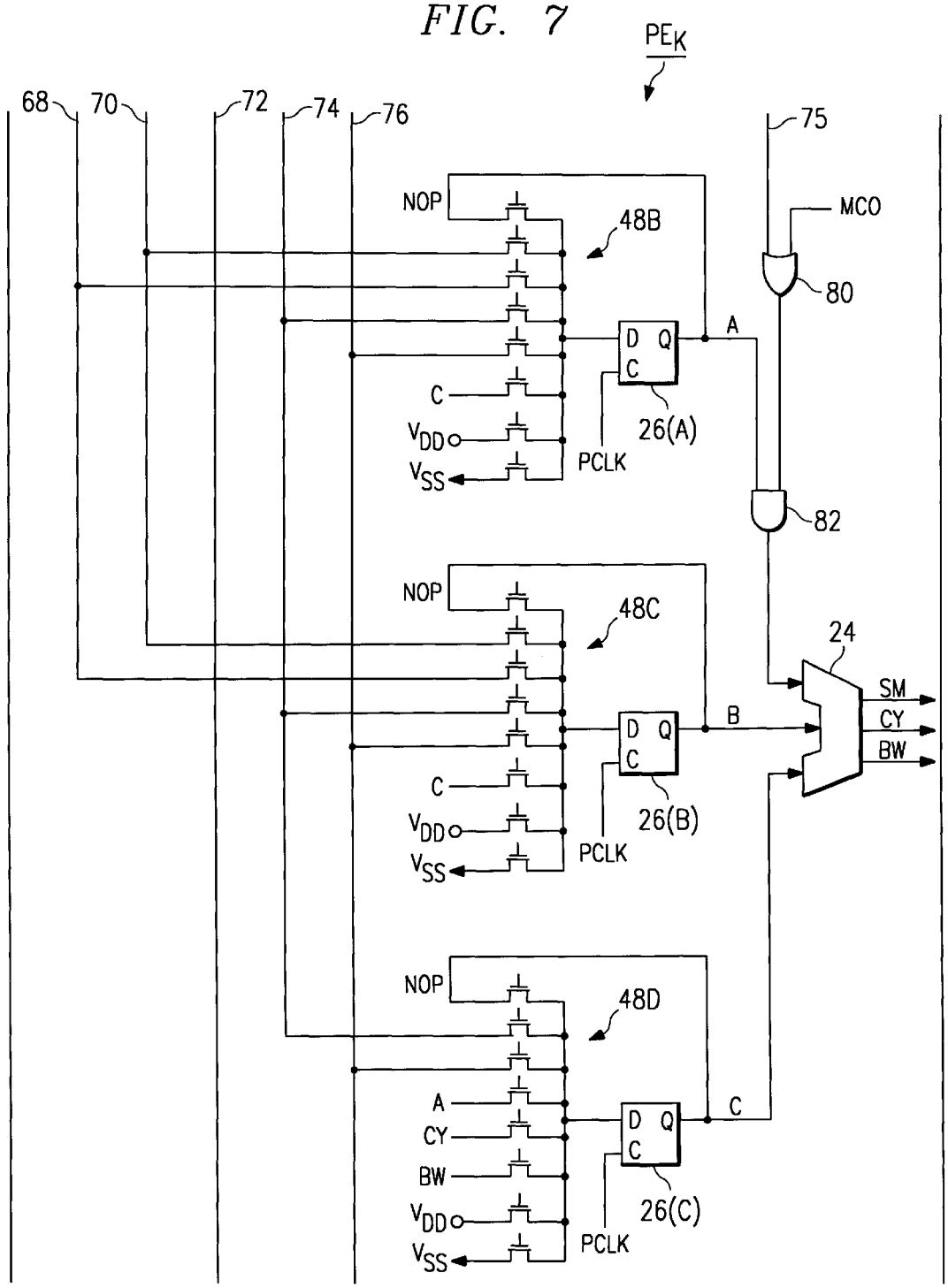
FIG. 7 is a circuit diagram of the specific configuration of each block of SVP containing the processing elements in the embodiment.

First register 26M of working register 26 is made of D flip-flops, with its data output terminal (Q) connected through line 75 to one input terminal of OR circuit 80 (FIG. 7).

Operation-data-selecting first multiplexer 48A for selecting the data to be fetched into first register 26M is made of multiple (e.g., 8) NMOS transistors controlled by microinstructions. In this example, first multiplexer 48A has a configuration that enables selective input of the following data: data (NOP) from data output terminal (Q) of first register 26 (M), the data sent from receiving multiplexers 34, 36 of LR communication unit 28 through lines 70, 68, the data sent from data output terminals (Q) of read-data-holding first latch circuits 40A and 40B through lines 74 and 76, the data from the output terminal of fourth register 26 C, the "1" data from power source terminal VDD, and the "0" data from power source terminal VSS.

As shown in FIG. 7, second register 26 A, third register 26 B, and fourth register 26 C of working register 26 are made of D flip-flops. Each of data output terminals (Q) of third register 26 B and fourth register 26 C is directly connected to one of the input terminals of ALU 24. Data output terminal 26 Q of second register 26 A is connected to one of the input terminals of AND circuit 82. The output terminal of OR circuit 80 is connected to the other input terminal of AND circuit 82, and the output terminal of AND circuit 82 is connected to one of input terminals of ALU 24.

The data from first register 26M is conditionally sent to AND circuit 82 by means of control signal (microinstruction) MC0 of OR circuit 80, and logical multiplication is performed with the data from the second register 26A. The data of the multiplication operation from AND circuit 82 are added to the data from third register 26B or fourth register 26C with ALU 24. In this way, the multiplication/addition operation is carried out in a single cycle. The data of the operation result obtained from the output terminal of ALU 24, that is, sum output (SM), carry (CY), and borrow (BW) is sent to the various portions.

The second and third multiplexers 48B and 48C for selecting the operation data corresponding to the second and third registers 26A and 26B have the same wiring connection (same as the input data) with the same circuit configuration as that of the first multiplexer 48A.

Fourth multiplexer 48D has the same circuit configuration, yet a portion of the wiring connection, that is, a portion of the input data, is different. The configuration of the fourth multiplexer 48D is arranged appropriately to ensure that the following data can be selectively input: the data (NOP) from data output terminal (Q) of fourth register 26C, the data sent from data output terminal (Q) of read-data-holding first latch circuits 40A and 40B through lines 74 and 76, the data from the output terminal of second register 26A, the data of carry output (CY) and borrow (BW) from the output terminal of ALU 24, the data of "1" from power source terminal VDD, and the data of "0" from power source terminal VSS.

Figure 8:
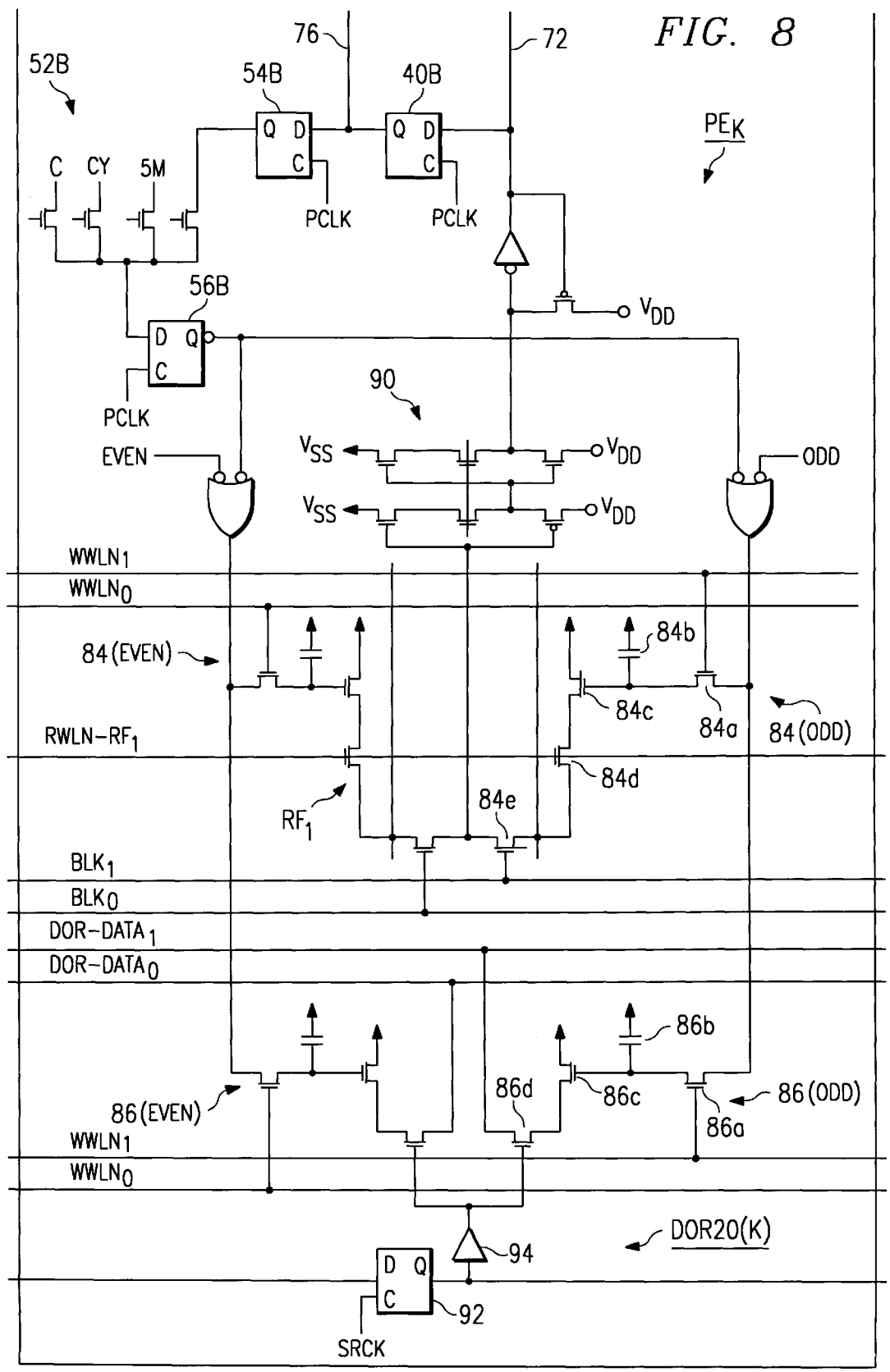
FIG. 8 is a circuit diagram of the specific configuration of each block of SVP containing the processing elements in the embodiment.

As shown in FIG. 8, the even-numbered side and odd-numbered side DRAM cells (84 EVEN) and (84 ODD) and sense amplifier 90 of register file RF1 have the same configuration and perform the same operation as those of DRAM cells (62 EVEN) and (62 ODD) and sense amplifier 64 in the register file RF0. Read bit lines (DOR-DATA0) and (DOR-DATA1) connected to the even-numbered side and odd-numbered side DRAM cells (86 EVEN), (86 ODD) that form DOR 20 are connected to the sense amplifier (not shown) of the SVP core output circuit, instead of the sense amplifier 90. Also, for each of the even-numbered side and odd-numbered side DRAM cells (86 EVEN), (86 ODD) of DOR 20, multiple stages are connected to the stage number equal to the bit number of the output pixel data (e.g., 16 stages).

In the case of output of the image data, by means of control of a pointer made of latch circuit 92 and buffer 94, with a prescribed timing, the (32-bit) data from all (32 cells) of DRAM cells (86 EVEN) and (86 ODD) of DOR 20 is read as the pixel data DK' of the final processing result of the corresponding processing element PEk to the corresponding read bit lines (DOR-DATA0) and (DOR-DATA1) and output as attached to the trailing end of the preceding pixel data D1', D2'... Dk–1' on one horizontal scan line.

Figure 9:
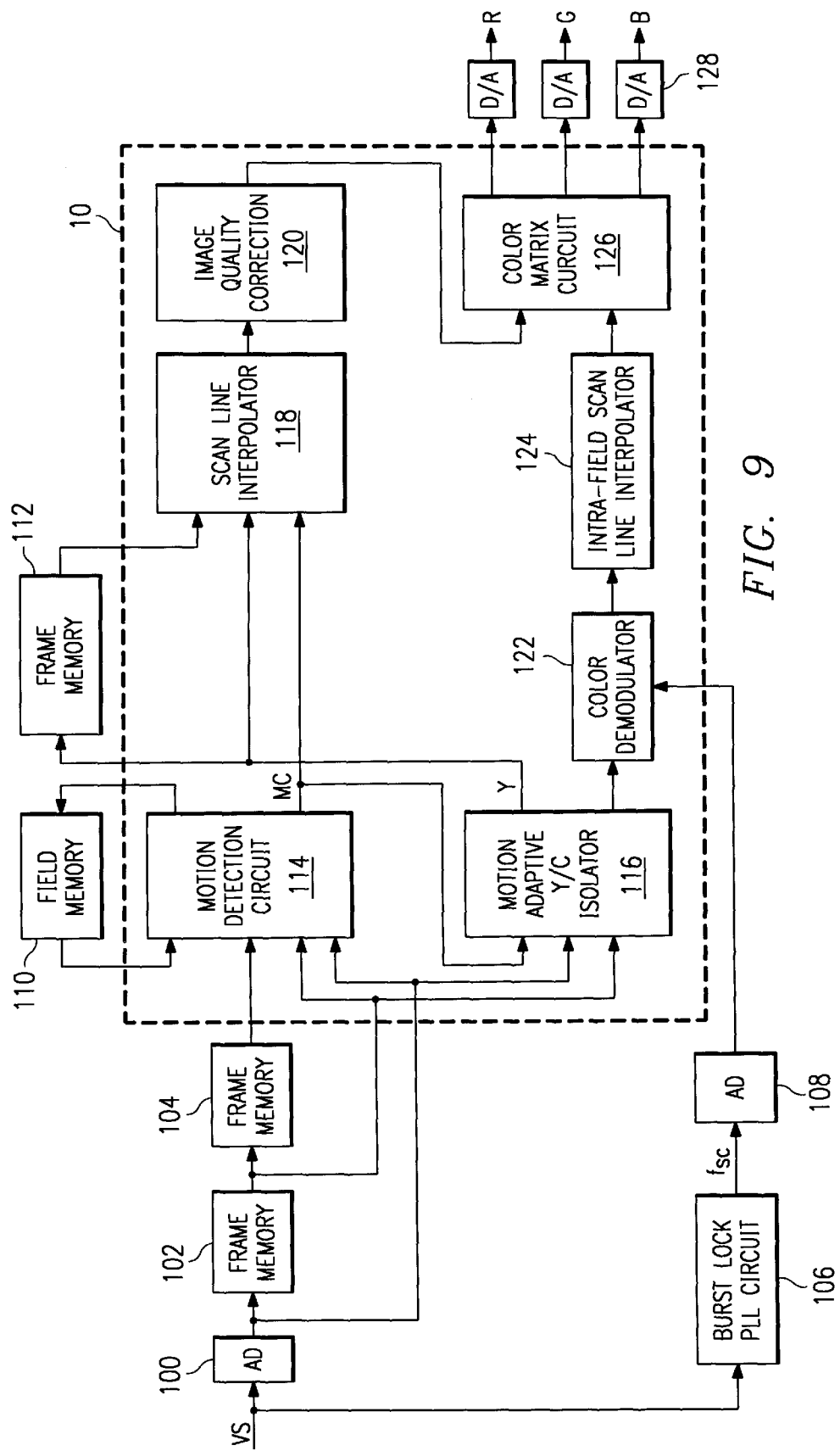
FIG. 9 is a block diagram illustrating an example of the movie picture real-time processing using SVP in the embodiment.

FIG. 9 shows an example of the motion picture real-time processing by means of SVP 10 in this embodiment. In this image processing apparatus, SVP 10 is used to perform the various processing operations: motion detection 114, motion adaptive Y/C isolation 116, motion adaptive scan line interpolation 118, image quality correction 120, color demodulation ACC/ACK isolation 122, scan line interpolation 124, and color matrix 126.

The analog composite signal VS is input to SVP 10 through frame memories 102 and 104 after it is converted into a digital signal (image signal) by A/D converter 100. In SVP 10, the signals of motion of the image made of the input image data and the image data delayed by 1 frame and 2 frames, respectively, are determined 104. Also, in order to prevent erroneous detection, field memory 110 is used. Then, by using motion detection signal MC from the input image data and the image data delayed from it by 1 frame, the Y/C isolation of the motion adaption is performed, and the luminance signal Y is fetched 118. For this luminance signal, processing of motion adaption scan line interpolation 118 and image quality correction 120 is carried out. Burst lock PLL circuit 106 extracts the chrominance signal; by using color demodulation carrier fsc digitized by A/D converter 108, chrominance signals R-Y/B-Y are demodulated at color demodulator ACC/ACK 122, and intra-field scan line interpolation 124 is carried out. Finally, for the luminance signal and chrominance signal, the color matrix operation 126 is performed, and analog original color signal RGB is output at a doubled speed through D/A converter 128.

In the conventional SVP, the number of the operations (throughput) that can be performed by each processing element PEk during one scan line period is limited. In the conventional scheme, in order to perform the real-time processing of the motion pictures is carried out, multiple (e.g., 3) SVPs are connected in series to share the processing of the various portions. On the other hand, for SVP in this embodiment, since the throughput of each processing element PEk is significantly increased (quadrupled), and 4 times of the operations can be executed in each scan line period, it is possible to realize the real-time processing of motion pictures by using a single SVP.

Figure 10:
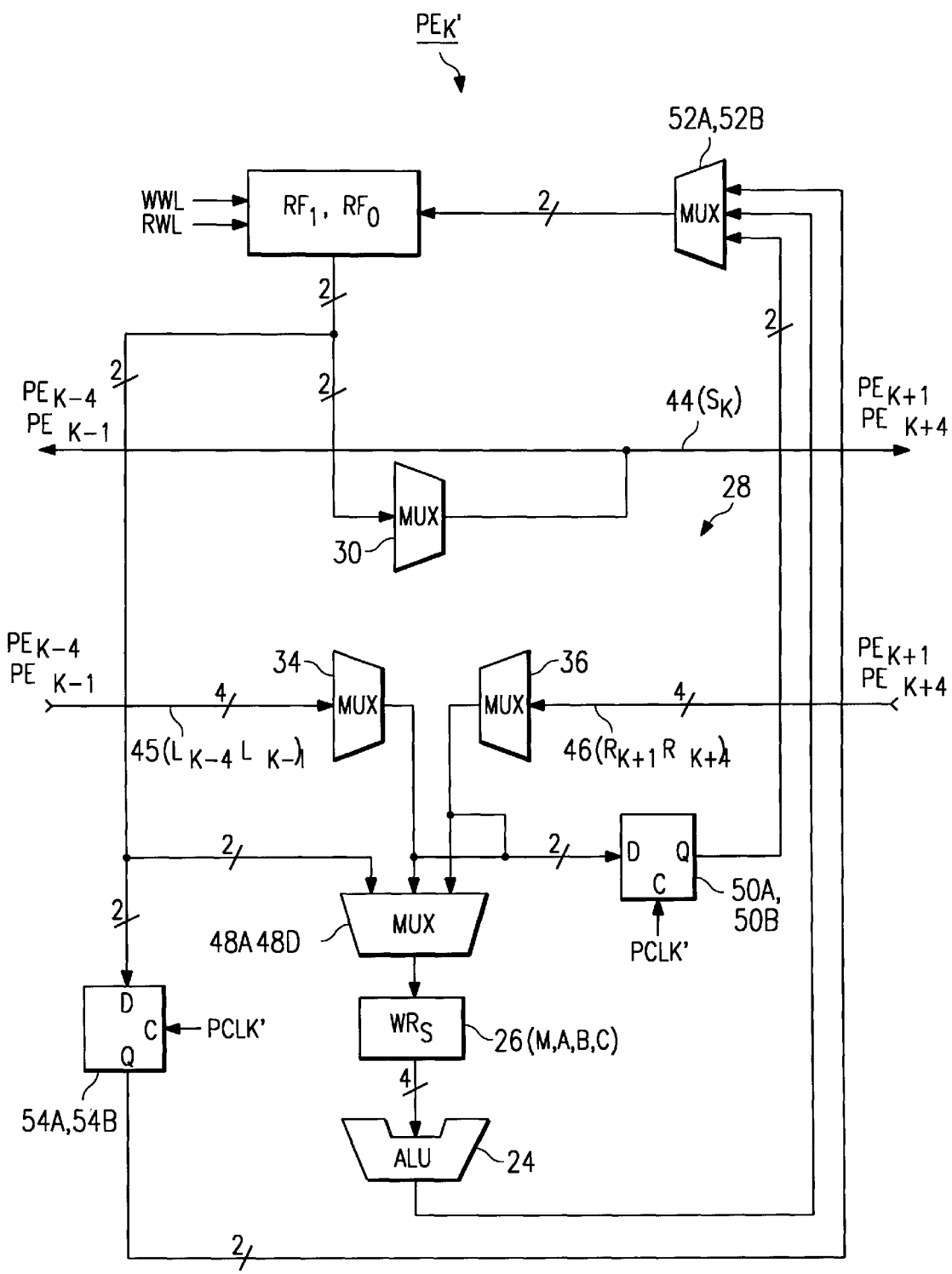
FIG. 10 is a block diagram of the configuration of a modified example of the processing element in the embodiment.

FIG. 10 shows the basic configuration of processing element PEk' in a modified example of the embodiment. As far as the hardware is concerned, this processing element PEk' is identical to the configuration of the processing element PEk in the embodiment, except that the following parts are absent: data-holding first latch circuits 40A and 40B, transmission latch circuit 32, and write-data-holding latch circuits 56A and 56B. The speed of clock PCLK' is ½ the speed of clock PLCK in the embodiment, that is, twice the speed of the conventional clock.

Figure 11:
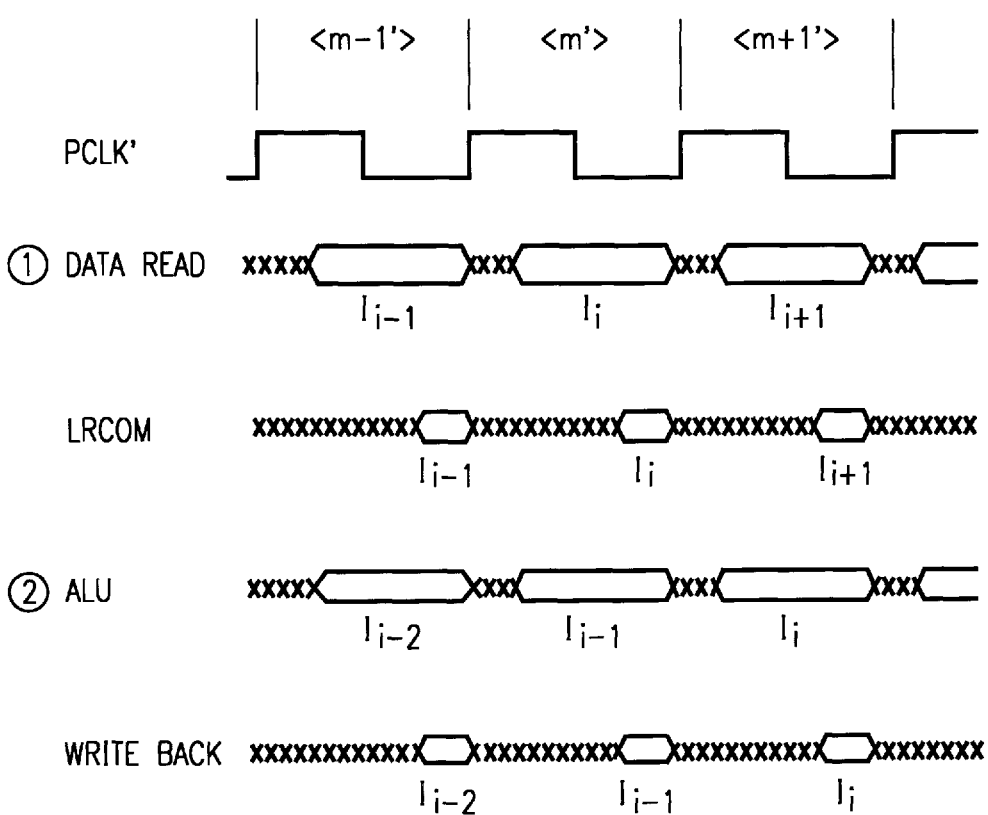
FIG. 11 is a timing chart of the timing of the various processing operations of the processing elements in FIG. 10.

FIG. 11 shows the timing of the operations of the various portions in this processing element PEk'.

For example, let's look at the processing for instruction Ii. In the first part of first cycle <m'>, as the data assigned by instruction Ii is read from register files RF0 and RF1 (DATA READ), the read data is selected by transmission multiplexer 30 in LR communication unit 28 in the latter part of first cycle <m'>, and they are immediately sent to a prescribed number of neighboring processing elements on the left and right sides. In receiving multiplexers 34 and 36 of LR communication unit 28 of the processing element PEk', data is fetched from a prescribed number of the left-side and right-side neighboring multiplexers in the latter part of the first cycle <m'>(LRCOM).

When it enters the second cycle <m+1'>, upon the rising edge of clock signal PCLK' at the start of the cycle, the read data or received data from operation-data-selection multiplexers 48A–48D is fetched into working registers 26 (M, A, B, C). At the same time, read data is fetched from register files RF0 and RF1 to data-holding latch circuits 54A and 54B, and the received data from receive multiplexers 34 and 36 is fetched into received-data-holding latch circuits 50A and 50B. For the data (the data assigned by instruction Ii) fetched in working registers 26 (M, A, B, C), ALU24 executes the prescribed operation, and the results of operation are output (ALU). The data of the results of operation is sent to write-data-selection multiplexers 52A and 52B.

Multiplexers 52A and 52B select one set of data from ALU 24, data-holding latch circuits 54A and 54B, and received-data holding latch circuits 50A and 50B. The selected data is written into register files RF0 and RF1 in the latter part of the second cycle <m+1'>(WRITE BACK).

In this way, in this processing element PEk', for each instruction Ii, during the first cycle <m'>, the processor executes the first step (DATA READ) which reads data from register files RF0 and RF1, and the second step (LRCOM) exchanges data conditionally with the prescribed number of neighboring processing elements on the left and right sides. Then, during the period of the second cycle <m+1'>, [the processor] executes the third step which executes an operation of the data obtained in the first and second steps, and the fourth step which writes any one of the data obtained in the first, second and third steps into register files RF0 and RF1 (WRITE BACK).

Then, with respect to two consecutive instructions Ii–1 and Ii, during the period of the first cycle <m>, while the first step (DATA READ) and the second step (LRCOM) for instruction Ii are executed, the third step (ALU) and the fourth step (WRITE BACk) are executed for instruction Ii–1.

In this way, in the processing element PEk' in this modified example, a clock with a speed twice that of the conventional clock is used, and, while the first step (DATA READ) and the second step (LRCOM) are executed in one cycle, the third step (ALU) and the fourth step (WRITE BACk) are also executed in one cycle. That is, for two consecutive instructions, the first and second steps (DATA READ) and (LRCOM), and the third and fourth steps (ALU)

and (WRITE BACK) are executed at the same time in each cycle. The number of operations executed per unit time or for one horizontal scanning period can be doubled.

Figure 19:
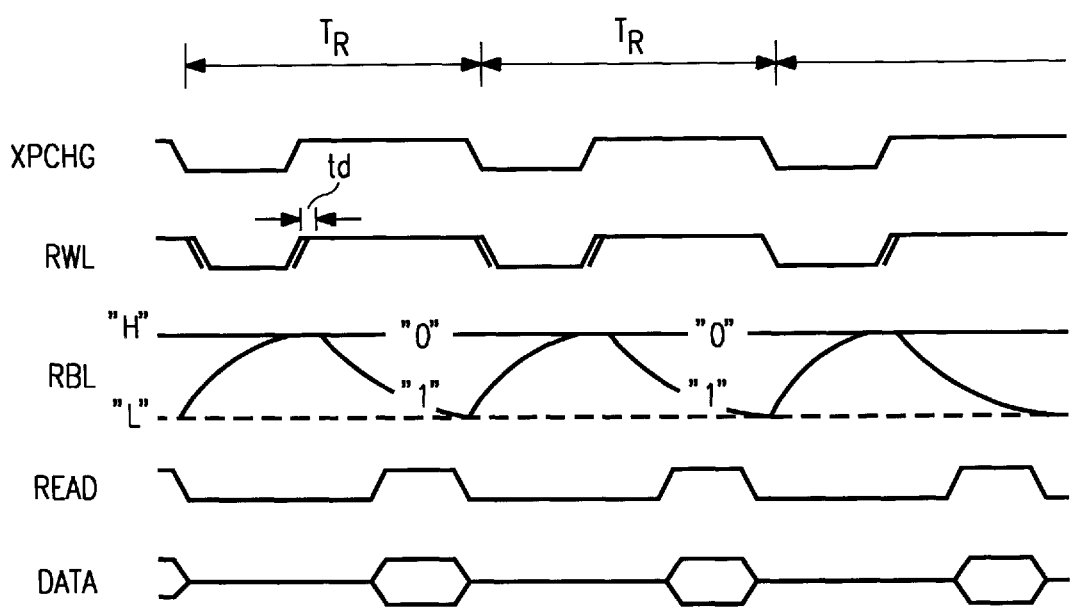
FIG. 19 is a signal waveform diagram of the waveforms of the signals of the various parts in FIG. 18 during reading operation of the current-read-type DRAM cell using the conventional reading method.

In the following, the other features of this invention will be explained. In the processing element PEk in this embodiment functions at the operating speed of the clock PCLK which is four times that of the conventional scheme, and reads the data from register files RF0 and RF1 in one cycle which is ¼ the time required in the conventional scheme. When current-read-type DRAM cells (62 EVEN), (62 ODD), (86 EVEN) and (86 ODD) are used as memory elements of these register files RF0 and RF1, as shown in FIGS. 5 and 8, if the conventional reading method is adopted (FIG. 19), it is difficult to realize high-speed reading in such a short cycle.

Figure 12:
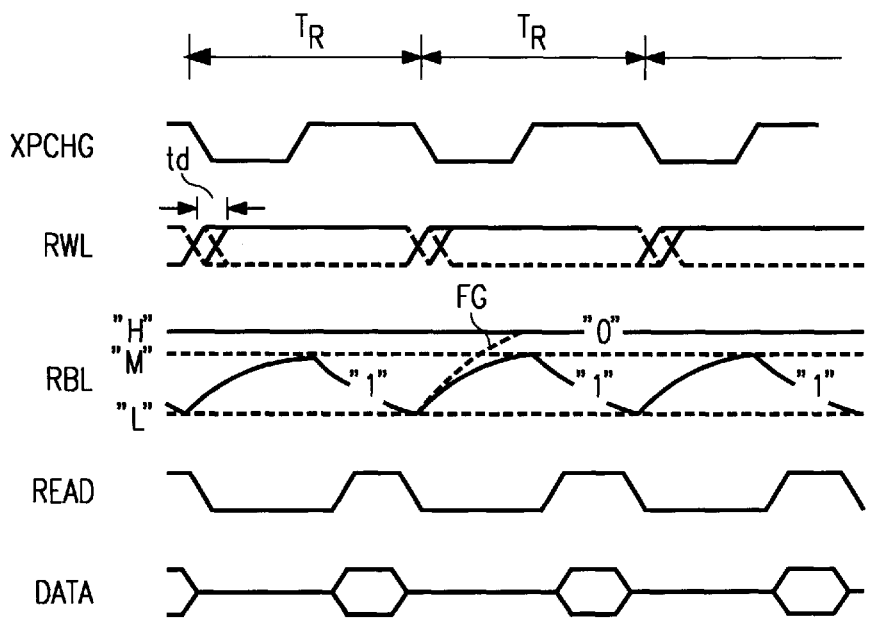
FIG. 12 is a signal waveform diagram of the function of the reading method of the current-read-type DRAM in an embodiment of this invention.
Figure 18:
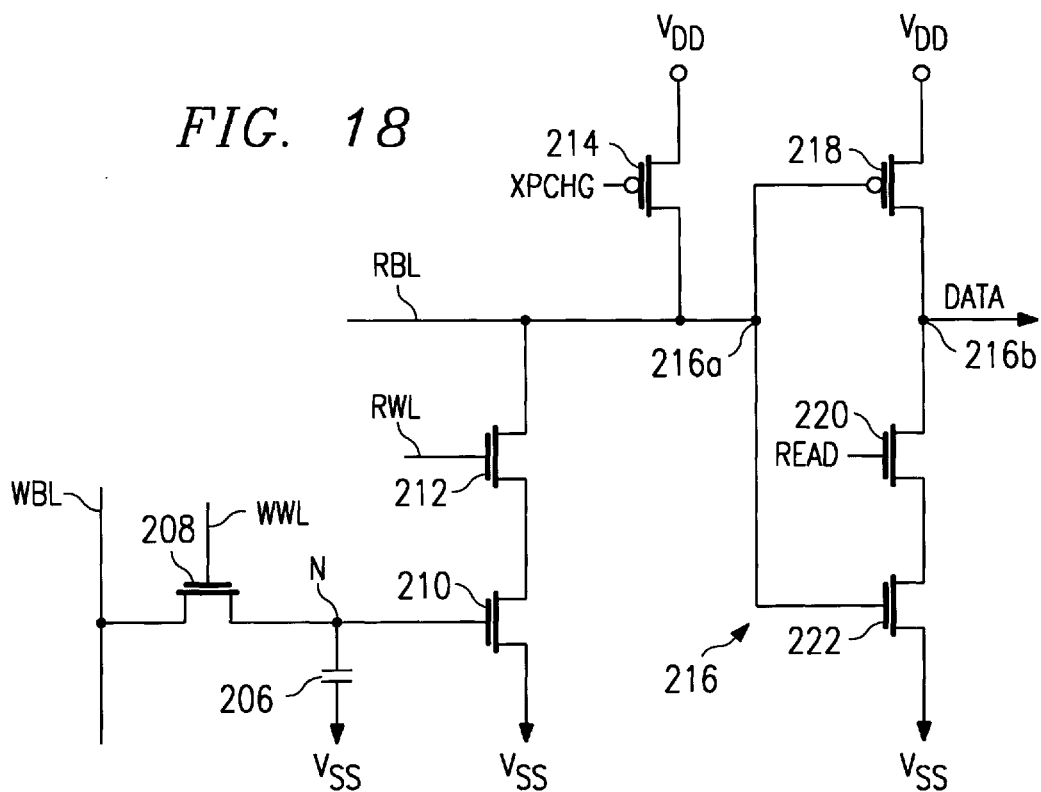
FIG. 18 is a circuit diagram of the configuration of the read circuit of the current-read-type DRAM cell.

This embodiment provides a novel method for high-speed reading of the current-read-type DRAM cells. FIG. 12 shows the function of this reading method. Also, in this embodiment, since the circuit configuration of current DRAM cells (62 EVEN), (62 ODD), (86 EVEN) and (86 ODD) itself is identical to that of the conventional scheme (FIG. 18), the explanation can be made with reference to FIG. 18.

As can be seen from FIG. 12, while precharge control signal XPCHG becomes active (L-level), read word line RWL is also made active (H-level). In this way, while PMOS type precharge transistor 214 conducts, NMOS access transistor 212 also conducts.

When information of "1" is stored in capacitor 206, current flows from power source voltage terminal VDD to read bit line RBL through precharge transistor 214 (charging). On the other hand, current flows from read bit line RBL to ground (VSS) through access transistor 212 and memory cell transistor 210 (discharging). Since the amount of charge fed from voltage terminal VDD is greater than the amount of charge discharged to ground, the potential of read bit line RBL rises over time from L-level near ground potential (VSS). However, it can only rise to near an intermediate level ("M") significantly lower (by about 2 V) from the H-level near the power source voltage VDD (3 V).

In this embodiment, even after the end of the precharge, that is, even after precharge control signal XPCHG becomes inactive (H-level) and precharge transistor 214 turns off, the read word line RWL still remains in the active state (H-level). In this way, read bit line RBL continues the discharge while no charge is fed. The voltage of bit line RBL starts decreasing immediately after the end of precharge. Then, when the voltage of bit line RBL drops lower than the threshold of the L-level (about 1.5 V), read control signal READ becomes active (H-level), the voltage of bit line RBL is determined and amplified by sense amplifier 216, and data of "1" (DATA) is read.

In this way, in this embodiment, as read bit line RBL is precharged while access transistor 212 conducts, when information "1" is stored in the memory cell, the precharge voltage of bit line RBL can rise only to an intermediate level ("M") between the threshold of the L-level (near 1.5 V) and the upper limit value of the H-level (near VDD). Immediately after the end of precharge, the intrinsic discharge is started, and the voltage of bit line RBL falls from the intermediate level ("M"); with prescribed timing, sense amplifier 216 is activated, and bit line voltage (H-level) corresponding to stored information "1" is determined.

By using this read method, at the end of the precharge operation, access transistor 212 conducts. The discharge of read bit line RBL starts immediately. A certain delay time td is needed for read word line RWL to rise to the H-level. As this takes place during the precharge period, the read rate is not affected at all. Then, after the end of precharge, bit line RBL is discharged from intermediate potential level "M." It is possible to cross the L-level threshold in a short time, and it is thus possible to fix the timing for activating control signal READ correspondingly.

Also, if "0" is stored in capacitor 206, as memory cell transistor 210 turns off, during the precharge period, charging is made for read bit line RBL without discharging, and the bit line voltage rises as indicated by the dotted-dashed line FG in FIG. 12 to near the H-level near power source voltage VDD. Then, as read control signal READ becomes active (H-level), the voltage of bit line RBL is determined and amplified by sense amplifier 216, and data of "0" (DATA) is read.

In this way, by using the read method of this invention, it is possible to shorten the reading speed [sic; the reading time] significantly for the current read type DRAM cells. As a matter of fact, in the conventional method, a read cycle TR requires 17 nsec. On the other hand, for the method of this invention, it is possible to shorten the read cycle TR to less than 10 nsec.

Figure 13:
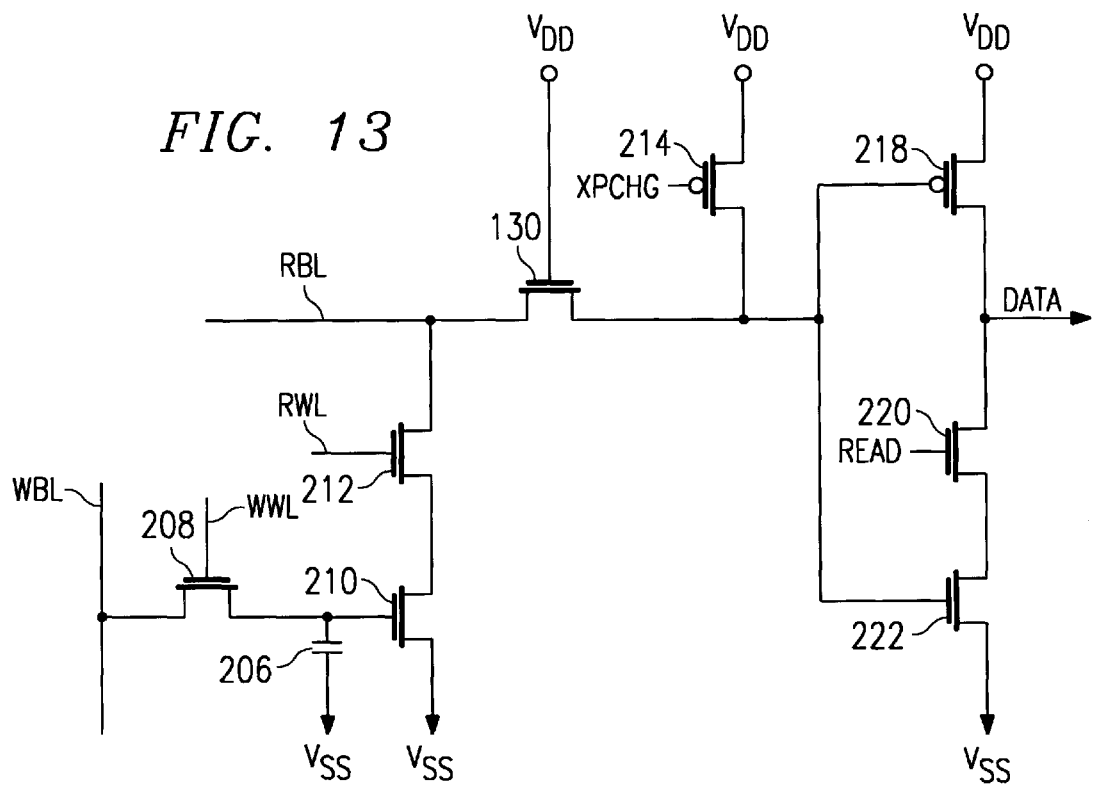
FIG. 13 is a circuit diagram illustrating a modified example of the current-read-type DRAM cell read circuit in the embodiment.

As shown in FIG. 13, a transistor 130 which normally conducts is inserted between precharge transistor 214 on read bit line RBL and the memory cell. In this configuration example, it is possible to adjust the intermediate level ("M") on read bit line RBL to a lower level.

Figure 14:
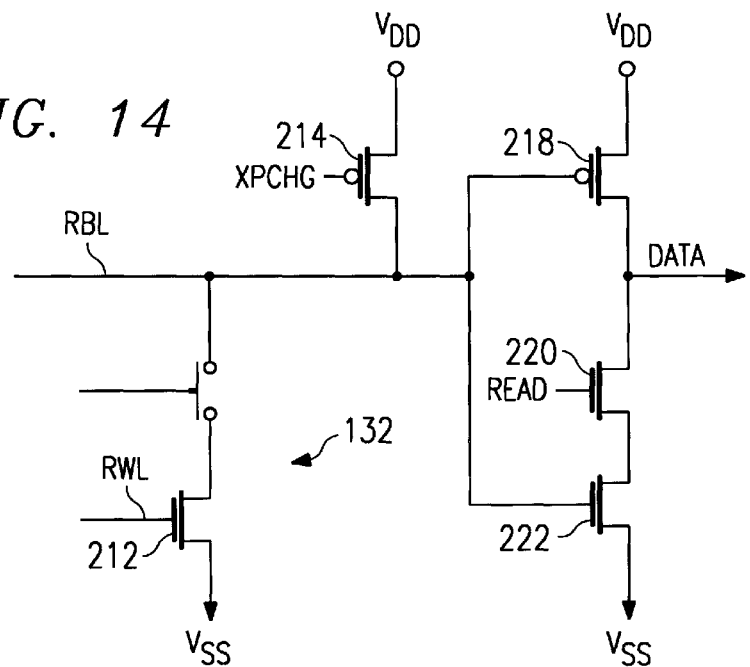
FIG. 14 is a circuit diagram illustrating an example of the reading circuit of the mask ROM cell for which the reading method of this invention is applicable.
Figure 15:
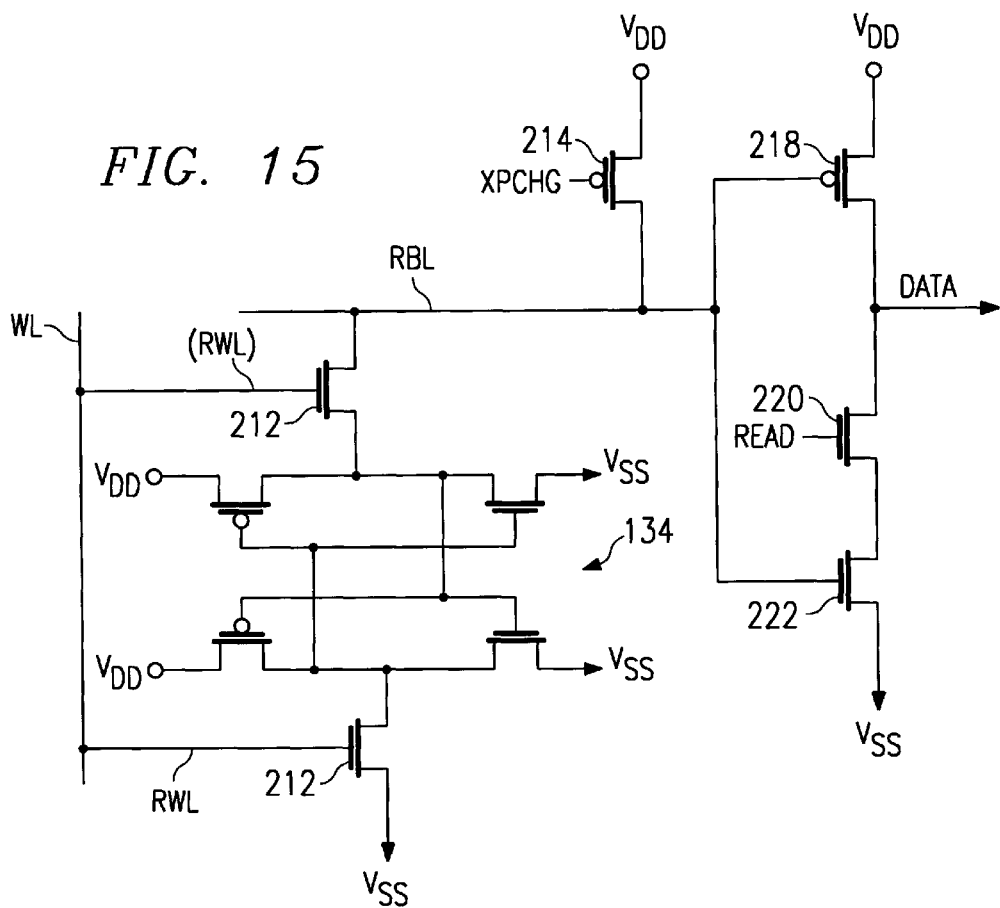
FIG. 15 is a circuit diagram illustrating an example of the read circuit of the SRAM cell for which the reading method of this invention is applicable.
Figure 16:
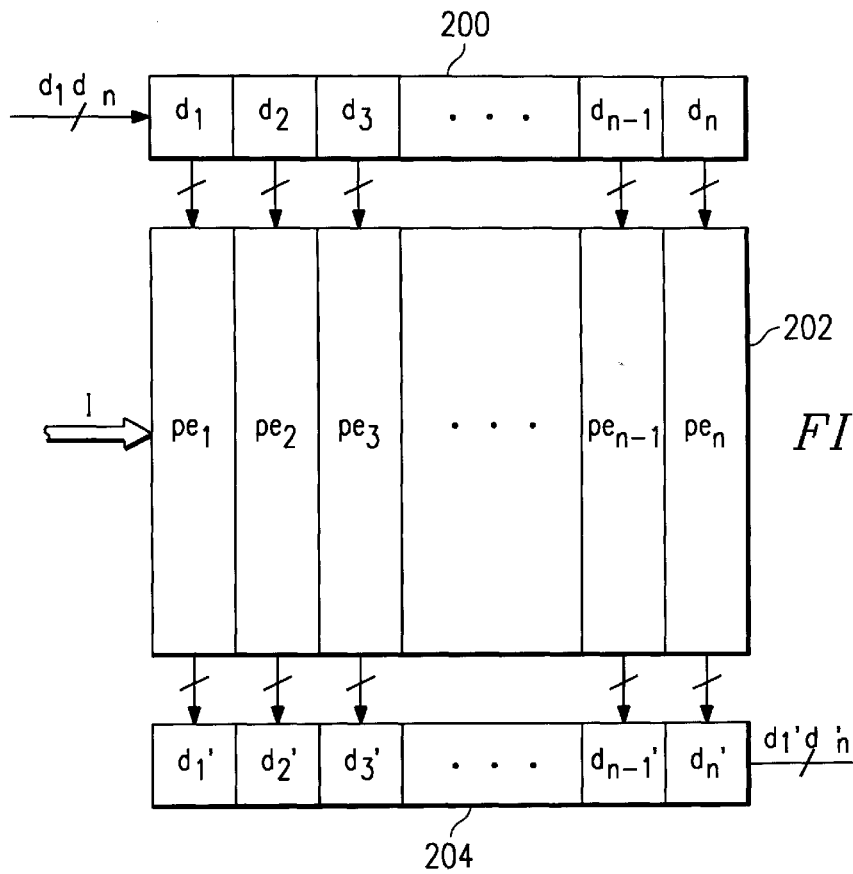
FIG. 16 is a block diagram of the configuration of the SVP containing the conventional SIMD digital signal processing apparatus.
Figure 17:
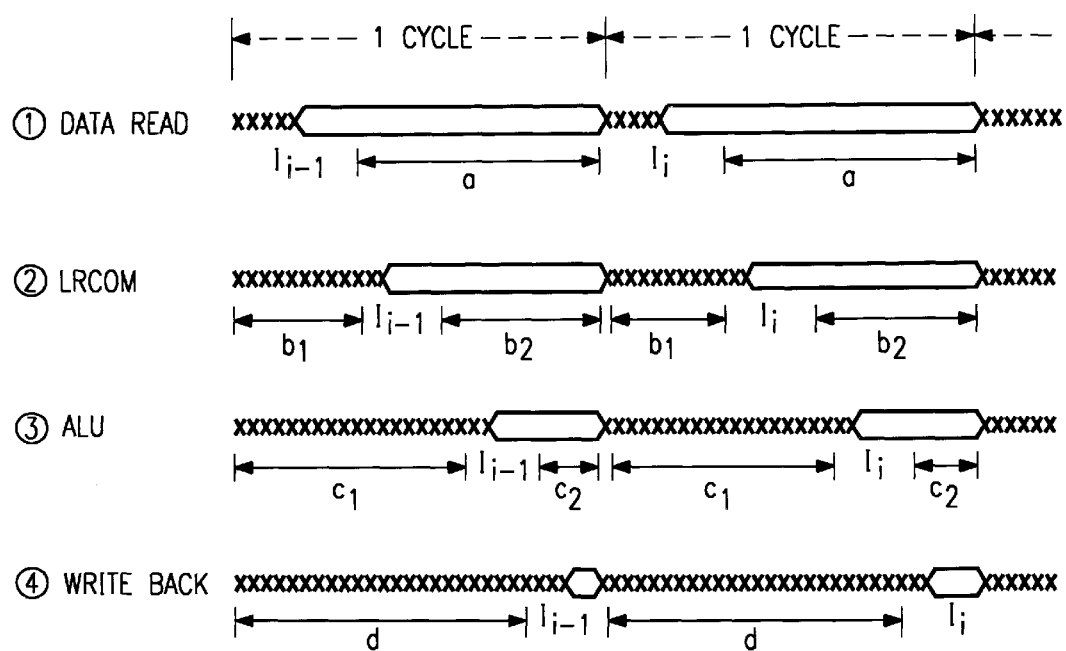
FIG. 17 is a timing chart of the timing of the various operation processings in the processing element in the conventional SIMD digital signal processing apparatus.

The read method of this invention is not limited to the current read type DRAM cells, and other current read type memory cells may also be used. For example, mask ROM (Read-only Memory) cell 132 shown in FIG. 14 and SRAM (Static Random Access Memory) cell 134 shown in FIG. 15 may also be used in the reading method of this invention. For ROM cell 132 shown in FIG. 14 and SRAM cell shown in FIG. 15, the same reference numeral as above 212 is used to denote the transistors that have the same function as that of the access transistor 212.

The SIMD digital signal processing apparatus of this invention is not limited to the image signal processing in the embodiment. It may be applied to any digital signal processing scheme. It is possible to set as desired the combination of multiple steps to be executed at the same time in one cycle.

As explained above, for the digital signal processing method and apparatus of this invention, in each of the multiple processing elements that execute the same processing in parallel, the following steps are executed in sequence: a first step in which data is read from a memory means, a second step in which a communication means makes conditional exchange with the prescribed number of neighboring processing elements, a third step in which the prescribed operation is carried out using the operating means, and a fourth step in which one of the data elements obtained in the first, second, and third steps is written into the memory means. For multiple consecutive instructions, at least two steps of these 4 steps are executed at the same time. Thus the number of cycles of instruction execution per unit time can be increased, and the throughput can be increased.

Also, for the current read type memory cell reading method of this invention, while the transistor of the memory cell with its control terminal connected to the word line, the read bit line is precharged in a prescribed time, and, in a prescribed timing, a sense amplifier determines the voltage of the bit line. The time from the end of precharge to establishment of the voltage on the bit line can be shortened significantly, and the reading rate can be increased significantly.

What is claimed is:

1. A method of reading a memory cell, said memory cell containing an access transistor, a word line and a memory storage means for holding information, said access transistor having a control terminal connected to said word line, said memory storage means being connected to said access transistor and thereby to a sense amplifier through a bit line, said access transistor operating in a conductive state in response to said word line, the method comprising the steps of:

precharging said bit line to an intermediate voltage level greater than a low threshold level and less than an upper limit level;

discharging said bit line from said intermediate voltage level to produce a low voltage level in a prescribed time if said memory storage means holds memory information of a first state;

charging said bit line to approximately said upper limit level in said prescribed time if said memory storage means holds memory information of a second state; and determining the voltage of said bit line by said sense amplifier after said prescribed time so that said memory information is read.

2. The method of claim 1 wherein the step of precharging occurs while said access transistor is in said conductive state.

3. The method of claim 1 wherein the step of discharging occurs while said access transistor is in said conductive state.

4. The method of claim 1 wherein the step of discharging begins at approximately the same time as the step of precharging.

5. The method of claim 1 wherein only the step of charging or the step of precharging is performed as determined by said memory information state.

6. A method of reading a memory cell, said memory cell containing an access transistor, a word line, and a memory storage means for holding information, said access transistor having a control terminal connected to said word line, said memory storage means being connected to said access transistor and thereby to a sense amplifier through a bit line, said access transistor operating in a conductive state in response to said word line, the method comprising the steps of:

storing memory information in said memory storage means, said memory information being either a first state or a second state;

operating said memory storage means in a conductive state if said memory information is in said first state, and operating said memory storage means in a non-conductive state if said memory information is in said second state;

charging said bit line at a first rate while simultaneously conditionally discharging said bit line at a second rate for a first period of time, said conditional discharge being responsive to said memory information, such that said bit line is precharged to an intermediate voltage level if said memory information is in said first state, and such that said bit line is precharged to a high voltage level which is higher than said intermediate voltage level if said memory information is in said second state;

discharging said bit line for a second period of time from said intermediate voltage level to produce a low voltage level in a prescribed time if said memory storage means holds memory information of said first state; and determining the voltage level of said bit line by said sense amplifier after said prescribed time so that said memory information is read.

7. The method of claim 6, wherein said first rate is higher than said second rate.

8. The method of claim 7, further comprising operating said access transistor in a conductive state during said first period of time and said second period of time.

9. The method of claim 8, wherein the step of conditionally discharging further comprises discharging said bit line at said second rate through said access transistor and through said memory means in a serial manner.

10. The method of claim 9, wherein the step of discharging further comprises discharging said bit line at said second rate through said access transistor and through said memory means in a serial manner.

* * * * *